US012408401B2

(12) United States Patent
Kinoshita

(10) Patent No.: US 12,408,401 B2
(45) Date of Patent: Sep. 2, 2025

(54) SILICON CARBIDE SEMICONDUCTOR DEVICE AND METHOD OF MANUFACTURING SILICON CARBIDE SEMICONDUCTOR DEVICE

(71) Applicant: FUJI ELECTRIC CO., LTD., Kawasaki (JP)

(72) Inventor: Akimasa Kinoshita, Matsumoto (JP)

(73) Assignee: FUJI ELECTRIC CO., LTD., Kawasaki (JP)

( * ) Notice: Subject to any disclaimer, the term of this patent is extended or adjusted under 35 U.S.C. 154(b) by 385 days.

(21) Appl. No.: 17/682,589

(22) Filed: Feb. 28, 2022

(65) Prior Publication Data
US 2022/0344475 A1 Oct. 27, 2022

(30) Foreign Application Priority Data
Apr. 27, 2021 (JP) .................................. 2021-074572

(51) Int. Cl.
*H10D 62/832* (2025.01)
*H10D 62/10* (2025.01)

(52) U.S. Cl.
CPC ....... *H10D 62/8325* (2025.01); *H10D 62/105* (2025.01)

(58) Field of Classification Search
CPC ............. H01L 29/1608; H01L 29/0615; H01L 29/0623; H01L 29/0638; H01L 29/1095;
(Continued)

(56) References Cited

U.S. PATENT DOCUMENTS 5,691,553 A * 11/1997 Mori ..................... H01L 29/408
257/490
5,994,754 A * 11/1999 Hayashi ............. H01L 29/0615
257/490
(Continued)

FOREIGN PATENT DOCUMENTS

JP     H08-88346 A      4/1996
JP     2002368215 A    12/2002
(Continued)

OTHER PUBLICATIONS

Extended European Search Report in the counterpart European Patent Application No. 22163968.5 dated Oct. 10, 2022.
(Continued)

*Primary Examiner* — Bitew A Dinke
(74) *Attorney, Agent, or Firm* — Rabin & Berdo, P.C.

(57) ABSTRACT

In an edge termination region, a FLR structure configured by FLRs having a floating potential and surrounding concentrically a periphery of an active region is provided. The FLR structure is divided into at least two FLR segments with a predetermined FLR as a boundary. An n-th interval between an adjacent two of the FLRs is wider than a first interval between a p⁺-type extension portion and the FLR closest to a chip center (n=2 to total number of the FLRs). The n-th interval between an adjacent two of the FLRs increases in arithmetic progression the closer the adjacent two are to a chip end, the n-th interval increasing in arithmetic progression by a corresponding one of constant increase increments respectively corresponding to the FLR segments; the closer a FLR segment is to the chip end, the wider is the constant increase increment corresponding thereto.

13 Claims, 10 Drawing Sheets

(58) Field of Classification Search
CPC ............. H01L 29/0619; H01L 29/0661; H01L 29/66068; H01L 29/7811; H01L 29/7813; H01L 21/265; H01L 29/06; H10D 62/8325; H10D 62/105; H10D 30/0245; H10F 71/139

See application file for complete search history.

(56) References Cited

U.S. PATENT DOCUMENTS

| | | | | |
|---|---|---|---|---|
| 11,527,660 | B2* | 12/2022 | Hoshi | H01L 29/7813 |
| 2003/0042549 | A1 | 3/2003 | Fujihira et al. | |
| 2003/0218220 | A1* | 11/2003 | Takahashi | H10D 12/441 |
| | | | | 257/E29.198 |
| 2009/0200559 | A1* | 8/2009 | Suzuki | H01L 29/1095 |
| | | | | 257/77 |
| 2011/0291241 | A1* | 12/2011 | Yoshikawa | H10D 12/441 |
| | | | | 257/544 |
| 2014/0197422 | A1* | 7/2014 | Wada | H01L 29/0619 |
| | | | | 257/77 |
| 2014/0327019 | A1* | 11/2014 | Kinoshita | H01L 29/41 |
| | | | | 257/77 |
| 2015/0084124 | A1* | 3/2015 | Saito | H10D 62/106 |
| | | | | 257/330 |
| 2015/0279931 | A1* | 10/2015 | Chen | H10D 12/441 |
| | | | | 257/495 |
| 2016/0049463 | A1* | 2/2016 | Buchholz | H10D 8/60 |
| | | | | 257/493 |
| 2017/0012122 | A1* | 1/2017 | Takaya | H01L 29/66068 |
| 2017/0179235 | A1* | 6/2017 | Kinoshita | H01L 29/0615 |
| 2018/0019301 | A1* | 1/2018 | Yasuda | H01L 29/872 |
| 2018/0040688 | A1 | 2/2018 | Kobayashi et al. | |
| 2018/0166530 | A1 | 6/2018 | Lichtenwalner et al. | |
| 2019/0131412 | A1* | 5/2019 | Ozaki | H10D 62/105 |
| 2019/0341308 | A1* | 11/2019 | Urakami | H01L 29/7397 |
| 2019/0386095 | A1* | 12/2019 | Takeuchi | H01L 29/0878 |
| 2020/0006409 | A1* | 1/2020 | Bakowski Holtryd | G01N 23/046 |
| 2020/0227549 | A1* | 7/2020 | Noborio | H01L 29/66734 |
| 2020/0328273 | A1* | 10/2020 | Sakata | H10D 30/665 |
| 2021/0083044 | A1* | 3/2021 | Yoshikawa | H01L 29/8611 |
| 2022/0093729 | A1* | 3/2022 | Kanie | H10D 62/8325 |
| 2022/0199824 | A1* | 6/2022 | Kinoshita | H01L 29/1095 |
| 2022/0344475 | A1* | 10/2022 | Kinoshita | H01L 29/0661 |
| 2023/0062475 | A1* | 3/2023 | Kumada | H01L 29/66068 |

FOREIGN PATENT DOCUMENTS

| | | |
|---|---|---|
| JP | 2008010506 A | 1/2008 |
| JP | 2011-101036 A | 5/2011 |
| JP | 2014-232838 A | 12/2014 |
| JP | 2018022851 A | 2/2018 |
| JP | 2019054087 A | 4/2019 |

OTHER PUBLICATIONS

Japanese Office Action dated Jan. 14, 2025, in the counterpart Japanese Patent Application No. 2021-074572.

* cited by examiner

FIG.3

| No. | 1 | 2 | 3 | 4 | 5 | 6 | 7 | 8 | 9 | 10 | 11 | 12 | 13 | 14 | 15 |
|---|---|---|---|---|---|---|---|---|---|---|---|---|---|---|---|
| | FLR SEGMENT 30a | | | | | | | | | | FLR SEGMENT 30b | | | | |
| INTERVAL $x_m$ (μm) | 1 | 1.05 | 1.1 | 1.15 | 1.2 | 1.25 | 1.3 | 1.35 | 1.4 | 1.45 | 1.53 | 1.61 | 1.69 | 1.77 | 1.85 |

| No. | 16 | 17 | 18 | 19 | 20 | 21 | 22 | 23 | 24 | 25 | 26 | 27 | 28 | 29 | 30 |
|---|---|---|---|---|---|---|---|---|---|---|---|---|---|---|---|
| | FLR SEGMENT 30b | | | | | | | | FLR SEGMENT 30c | | | | | | |
| INTERVAL $x_m$ (μm) | 1.93 | 2.01 | 2.09 | 2.17 | 2.25 | 2.37 | 2.49 | 2.61 | 2.73 | 2.85 | 2.97 | 3.09 | 3.21 | 3.33 | 3.45 |

FIRST INTERVAL $x_{101}$=1.0μm

FIRST INTERVAL $x_{101}$=0.7μm

SILICON CARBIDE SEMICONDUCTOR DEVICE AND METHOD OF MANUFACTURING SILICON CARBIDE SEMICONDUCTOR DEVICE

CROSS REFERENCE TO RELATED APPLICATIONS

This application is based upon and claims the benefit of priority of the prior Japanese Patent Application No. 2021-074572, filed on Apr. 27, 2021, the entire contents of which are incorporated herein by reference.

BACKGROUND OF THE INVENTION

1. Field of the Invention

Embodiments of the invention relate to a silicon carbide semiconductor device and method of manufacturing a silicon carbide semiconductor device.

2. Description of the Related Art

A voltage withstanding structure of a power semiconductor device is configured by multiple p-type regions selectively provided in surface regions of an n-type drift region exposed at a front surface of a semiconductor substrate, in an edge termination region between an active region and an end of a semiconductor substrate (semiconductor chip). In an instance in which a semiconductor material of the power semiconductor device is silicon carbide (SiC) for which a critical electric field strength is at least 10 times a critical electric field strength of silicon (Si), a multizone junction termination extension (JTE) structure, a spatially modulated JTE structure, a field limiting ring (FLR) structure are mainly disposed as the voltage withstanding structure.

The multizone JTE structure is a structure in which at least three p-type regions (hereinafter, JTE regions) are disposed adjacent to one another concentrically surrounding a periphery of the active region so as to be in descending order of impurity concentration from a chip center side (active region (center portion of the semiconductor chip: chip center) side) to a chip outer side (semiconductor substrate end (chip end)). The electric field strength tends to decrease with increasing distance from the active region in a direction to the chip end. Therefore, in the multizone JTE structure, according to the tendency of the electric field strength distribution, the impurity concentrations of corresponding JTE regions disposed relatively closer to the chip outer side are lower than the impurity concentrations of JTE regions disposed relatively closer to the active region, whereby a predetermined breakdown voltage is stably ensured.

The spatially modulated JTE structure is an improved structure of the JTE structure and between JTE regions adjacent to one another (in an instance of a configuration having only one JTE region, between the one JTE region and an n$^-$-type drift region on an outer side thereof facing the chip end), a spatially modulated region having an intermediate impurity concentration of these two regions and having a spatially equivalent impurity concentration distribution is disposed, the spatially modulated JTE structure being a structure in which an impurity concentration distribution of the JTE structure overall gradually decreases in a direction to the chip end. The spatially modulated region is formed by repeatedly disposing two small regions in a predetermined pattern, two small regions respectively having the same impurity concentration as regions adjacent thereto. The spatial impurity concentration distribution of an entire area of the spatially modulated region is determined by widths and an impurity concentration ratio of the two small regions.

The spatially modulated JTE structure may stably ensure the predetermined breakdown voltage compared to a general JTE structure without the spatially modulated region. The FLR structure is a structure in which multiple p-type regions (FLRs) having the same impurity concentration are disposed apart from one another concentrically surrounding a periphery of the active region. In the FLR structure, electric field is distributed by the multiple FLRs disposed apart from one another, thereby ensuring the predetermined breakdown voltage. In this manner, a predetermined voltage withstanding structure is disposed in the edge termination region, thereby mitigating or distributing the electric field of the edge termination region, whereby the breakdown voltage of the edge termination region is enhanced and thus the breakdown voltage of the semiconductor device overall is enhanced. A structure of a conventional silicon carbide semiconductor device is described.

FIG. 13 is a cross-sectional view depicting the structure of the conventional silicon carbide semiconductor device. A conventional silicon carbide semiconductor device 110 depicted in FIG. 13 is a vertical metal oxide semiconductor field effect transistor (MOSFET) with a trench structure having insulated gates (MOS gates) having a three-layer structure including a metal, an oxide film, and a semiconductor, and a FLR structure 130 provided in an edge termination region 102 of a semiconductor substrate (semiconductor chip) 140 containing silicon carbide. The edge termination region 102 surrounds a periphery of an active region 101 through which a main current of the MOSFET flows.

In the semiconductor substrate 140, silicon carbide layers 142, 143 constituting an n$^-$-type drift region 112 and a p-type base region 113 are sequentially grown epitaxially on an n$^+$-type starting substrate 111 containing silicon carbide. A portion of the p-type silicon carbide layer 143 in the edge termination region 102 is removed by etching, thereby forming a drop 124 at a front surface of the semiconductor substrate 140. The front surface of the semiconductor substrate 140 is recessed toward a drain electrode 125, at a second surface portion 140b closer to the chip outer side (end side of the semiconductor substrate 140) than is a first surface portion 140a of a chip center (center of the semiconductor substrate 140) side, with the drop 124 as a boundary.

Due to the drop 124, the p-type silicon carbide layer 143 is left in a mesa shape in a center of the front surface (main surface having the p-type silicon carbide layer 143) of the semiconductor substrate 140. The first and the second surface portions 140a, 140b of the front surface of the semiconductor substrate 140 are formed by the p-type silicon carbide layer 143 and the n$^-$-type the silicon carbide layer 142, respectively. In a center portion 101a of the active region 101, MOS gates constituted by trenches 116, gate insulating films 117, and gate electrodes 118, and the p-type base region 113, n$^+$-type source regions 114, and p$^{++}$-type contact regions 115 of the unit cells of the MOSFET are provided in a front side of the semiconductor substrate 140.

In a peripheral portion 101b of the active region 101, in a surface region at the first surface portion 140a of the front surface of the semiconductor substrate 140, a p$^+$-type extension portion 122a, a p-type base extension portion 113a, and a p$^{++}$-type contact extension portion 115a are selectively provided. The p$^+$-type extension portion 122a, the p-type base extension portion 113a, and the p$^{++}$-type contact extension portion 115a are, respectively, extended portions of an outermost p$^+$-type region 122, the p-type base region 113, and the p$^{++}$-type contact region 115 that is outermost, these regions configure a unit cell of the center portion 101a of the active region 101 and surround a periphery of the center portion 101a of the active region 101.

The p$^+$-type extension portion 122a, the p-type base extension portion 113a, and the p$^{++}$-type contact extension portion 115a extend toward the chip outer side and reach a third surface portion (mesa edge of the drop) 140c connecting the first surface portion 140a and the second surface portion 140b of the front surface of the semiconductor substrate 140. The p$^+$-type extension portion 122a extends closer to the chip outer side than does the drop 124 and is exposed at the second surface portion 140b of the front surface of the semiconductor substrate 140. Reference numerals 121 and 122 are p$^+$-type regions that mitigate electric field applied to the gate insulating films 117 at bottoms of the trenches 116. Reference numerals 119, 120, 125, 132 are, respectively, an interlayer insulating film, a source electrode, a drain electrode, and an n$^+$-type channel stopper region.

In the edge termination region 102, multiple p-type regions (FLRs: hatched portion) 131 of a floating potential and configuring the FLR structure 130 are selectively provided in the n$^-$-type the silicon carbide layer 142, in a surface region thereof at the second surface portion 140b of the front surface of the semiconductor substrate 140. The FLRs 131 are provided apart from one another, concentrically surrounding a periphery of the active region 101, at positions apart from the p$^+$-type extension portion 122a and closer to the chip outer side than is the p$^+$-type extension portion 122a. All the FLRs 131 face the p$^+$-type extension portion 122a in a normal direction (direction from the chip center side to the chip outer side). All the FLRs 131 are surrounded at peripheries thereof by the n$^-$-type drift region 112.

A first interval between the p$^+$-type extension portion 122a and the FLR 131 closest to the chip center is assumed as $x_{101}$ while an i-th interval between an i-th FLR 131 and an (i−1)-th FLR 131 adjacent thereto on a chip center side thereof and subsequent intervals in a direction to the chip end are assumed as $x_j$, $x_{j+1}$, . . . , respectively (where, i=2 to a total number of the FLRs 131, j=i+100). An i-th interval $x_j$ between an adjacent two of the FLRs 131 is wider than the first interval $x_{101}$ between the p$^+$-type extension portion 122a and the FLR 131 closest to the chip center, and the i-th interval $x_j$ between an adjacent two of the FLRs increases in arithmetic progression by a constant increase increment (amount in the normal direction) ($x_{j+1}-x_j$=constant), the closer the adjacent two of the FLRs are to the chip end. All the FLRs 131 have a same impurity concentration and a same width w101.

As a conventional silicon carbide semiconductor device, a device having a FLR structure in which an interval between an adjacent two of the FLRs increases in arithmetic progression by a constant increase increment, the closer the adjacent two of the FLRs are to the chip end has been proposed (for example, refer to Japanese Laid-Open Patent Publication No. 2011-101036 and Japanese Laid-Open Patent Publication No. H8-088346). In Japanese Laid-Open Patent Publication No. 2011-101036, due to a p-type RESURF region between the active region and the FLR structure, when a drain-source voltage becomes a high voltage, electric field concentrates near the FLR structure, not directly beneath the p-type RESURF region. In Japanese Laid-Open Patent Publication No. H8-088346, between adjacent FLRs, blocked voltage is stabilized by a field plate (FP) provided on an n$^-$-type drift region via an insulating layer.

Further, as a conventional silicon carbide semiconductor device, a device having, in an edge termination region, a FLR structure configured by multiple FLRs concentrically surrounding a periphery of an active region and disposed at equal intervals, and an n-type region provided between a second portion of a front surface of a semiconductor substrate and the multiple FLRs has been proposed (for example, refer to Japanese Laid-Open Patent Publication No. 2014-232838). In Japanese Laid-Open Patent Publication No. 2014-232838, due to the n-type region between the second portion of the front surface of the semiconductor substrate and the multiple FLRs, the FLRs are disposed at positions apart from the second portion of the front surface of the semiconductor substrate, whereby variation of a dose amount of the FLRs is reduced and variation of the breakdown voltage of the silicon carbide semiconductor device is reduced.

SUMMARY OF THE INVENTION

According to an embodiment of the invention, a silicon carbide semiconductor device includes a semiconductor substrate containing silicon carbide and having an active region and a termination region surrounding a periphery of the active region, the semiconductor substrate having a first main surface and a second main surface opposite to each other; a first semiconductor region of a first conductivity type, provided in the semiconductor substrate, spanning the active region and the termination region; a second semiconductor region of a second conductivity type, provided between the first main surface of the semiconductor substrate and the first semiconductor region in the active region; a device element structure having a pn junction between the first semiconductor region and the second semiconductor region, a current that energizes the pn junction flows in the device element structure; a second-conductivity-type peripheral region surrounding a periphery of the device element structure, provided between the first main surface of the semiconductor substrate and the first semiconductor region, between the device element structure and the termination region; a first electrode provided on the first main surface of the semiconductor substrate, electrically connected to the second semiconductor region and the second-conductivity-type peripheral region; a second electrode provided on the second main surface of the semiconductor substrate, electrically connected to the first semiconductor region; and a plurality of field limiting rings (FLRs) of the second conductivity type, the FLRs having a floating potential and configuring a FLR structure, the FLRs being provided apart from one another with respective intervals therebetween, each interval being a shortest distance between an adjacent two of the FLRs that are adjacent to each other, and each FLR concentrically surrounding the periphery of the active region, the plurality of FLRs being provided between the first main surface of the semiconductor substrate and the first semiconductor region in the termination region, the plurality of FLRs each facing a surface of the second-conductivity-type peripheral region, the surface of the second-conductivity-type peripheral region facing the termination region in the direction parallel to the first main surface of the semiconductor substrate. The plurality of FLRs includes at least one boundary FLR, and the FLR structure is divided into at least two FLR segments with the at least one boundary FLR as a boundary. An interval between any adjacent two of the FLRs that are adjacent to each other is wider than an interval between the second-conductivity-type peripheral region and a first FLR of the plurality of FLRs closest to the second-conductivity-type peripheral region of the plurality of FLRs. Within a same FLR segment, an interval of an adjacent two of the FLRs increases as the adjacent two of the FLRs approaches closer to an end of the semiconductor substrate by a constant increment in arithmetic progression. Each constant increment of each FLR segment among the at least two FLR segments increases as said each FLR segment approaches closer to the end of the semiconductor substrate.

Objects, features, and advantages of the present invention are specifically set forth in or will become apparent from the following detailed description of the invention when read in conjunction with the accompanying drawings.

BRIEF DESCRIPTION OF THE DRAWINGS

FIG. 3 is a table depicting examples of dimensions of intervals between adjacent FLRs in FIG. 2.

DETAILED DESCRIPTION OF THE INVENTION

Figure 1:
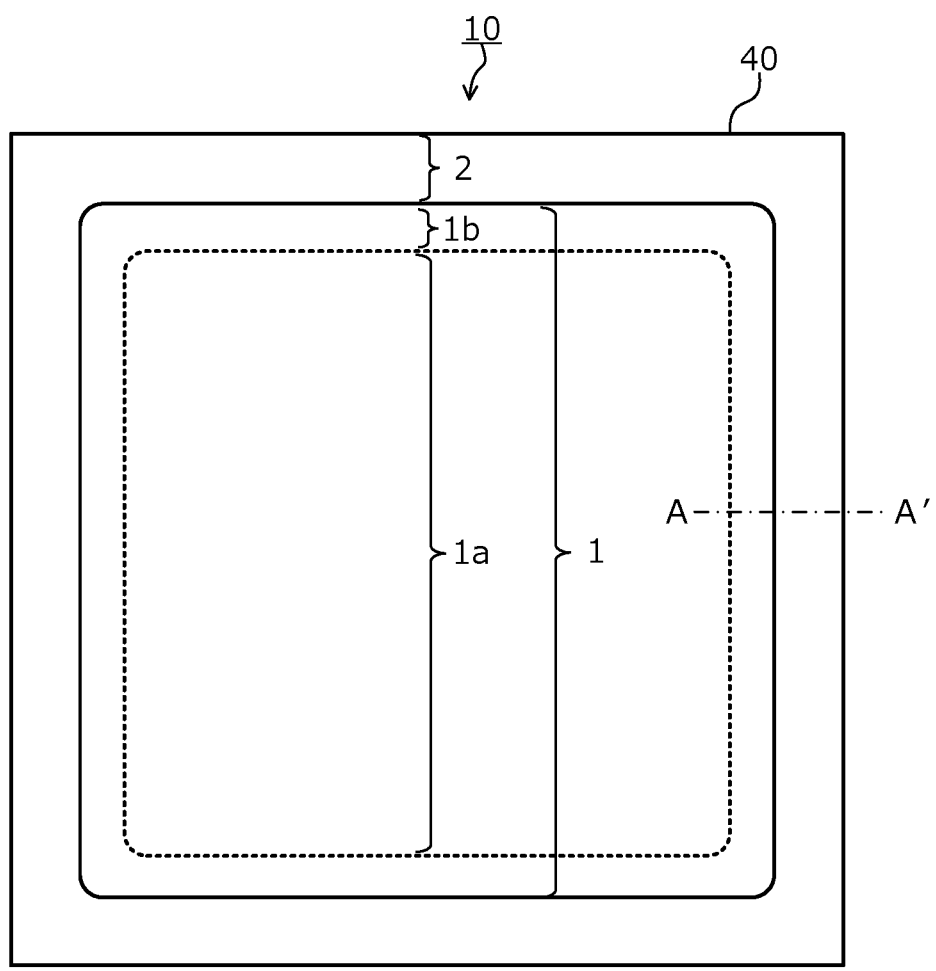
FIG. 1 is a plan view depicting a layout when a semiconductor device according to an embodiment is viewed from a front side of a semiconductor substrate.

First, problems associated with the conventional techniques are discussed. In a general JTE structure, to adjust the impurity concentration distribution according to tendency of the electric field strength distribution, the number of times ion implantation has to be performed is equal to the number of disposed JTE regions (p-type regions) having different impurity concentrations, whereby the number of processes increases, leading to increases in cost. In the spatially modulated JTE structure, while the number of ion implantation is reduced, adjustment of the impurity concentration distribution according to the tendency of the electric field strength distribution is necessary and therefore, the number of processes increases, leading to increases in cost.

In the conventional FLR structure 130 (refer to FIG. 13), all the FLRs 131 have the same impurity concentration and therefore, ion implantation suffices to be performed once, thereby reducing the number of processes and suppressing manufacturing cost nonetheless to stably ensure the predetermined breakdown voltage, a large area (length of the edge termination region 102) is necessary. Therefore, in an instance in which silicon carbide for which the wafer cost is high is used as a semiconductor material, increases in material cost become a major factor in increased cost.

Embodiments of a silicon carbide semiconductor device and a method of manufacturing a silicon carbide semiconductor device according to the present invention will be described in detail with reference to the accompanying drawings. In the present description and accompanying drawings, layers and regions prefixed with n or p mean that majority carriers are electrons or holes. Additionally, + or − appended to n or p means that the impurity concentration is higher or lower, respectively, than layers and regions without + or −. In the description of the embodiments below and the accompanying drawings, main portions that are identical will be given the same reference numerals and will not be repeatedly described.

Figure 2:
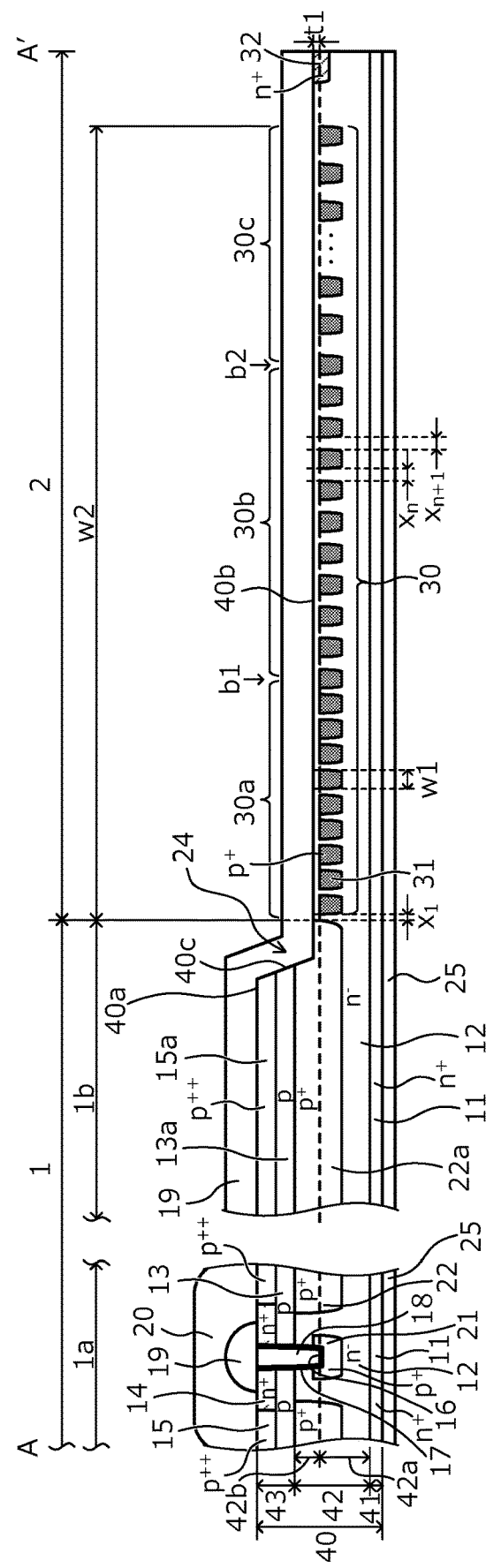
FIG. 2 is a cross-sectional view of a structure along cutting line A-A' in FIG. 1.

A structure of a silicon carbide semiconductor device according to an embodiment is described. FIG. 1 is a plan view depicting a layout when a semiconductor device according to the embodiment is viewed from a front side of a semiconductor substrate. FIG. 2 is a cross-sectional view of the structure along cutting line A-A' in FIG. 1. FIG. 3 is a table depicting examples of dimensions of intervals between adjacent FLRs in FIG. 2. A silicon carbide semiconductor device 10 according to the embodiment depicted in FIGS. 1 and 2 is a vertical MOSFET having a trench structure (device element structure) in an active region 1 of a semiconductor substrate (semiconductor chip) 40 containing silicon carbide (SiC), the silicon carbide semiconductor device 10 having a FLR structure 30 as a voltage withstanding structure in an edge termination region 2.

The active region 1 is a region in which a main current (drift current) flows when the MOSFET is ON and in a center portion 1a thereof, multiple unit cells (functional units of a device element) having a same structure are disposed adjacent to and are connected in parallel to one another. The active region 1 has a substantially rectangular shape in a plan view thereof and is disposed in substantially a center of a semiconductor substrate 40. The active region 1 is a portion in a chip center portion (a center (the chip center) portion of the semiconductor substrate 40), from a chip-outer-side end of a later-described p-type extension portion 22a (end thereof closest to an end (chip end) of the semiconductor substrate 40). The edge termination region 2 is a region between the active region 1 and the chip end, and surrounds a periphery of the active region 1 in substantially a rectangular shape. The FLR structure 30 in the edge termination region 2 is described later.

The semiconductor substrate 40 is formed by sequentially forming, by epitaxial growth, silicon carbide layers 42, 43 constituting an n$^-$-type drift region 12 and a p-type base region 13, on a front surface of an n$^+$-type starting substrate 41 containing silicon carbide. The semiconductor substrate 40 has a surface having the p-type silicon carbide layer 43 assumed as a front surface (first main surface) and another surface having the n$^+$-type starting substrate 41 assumed as a back surface (second main surface). A portion of the p-type silicon carbide layer 43 in the edge termination region 2 is removed by etching, whereby a drop 24 is formed at the front surface of the semiconductor substrate 40. Due to the drop 24, the p-type silicon carbide layer 43 is left in a mesa shape in the active region 1. The front surface of the semiconductor substrate 40 is recessed toward an n$^+$-type drain region 11 to a greater extent in a portion (second surface portion) 40b of the edge termination region 2 than in a portion (first surface portion) 40a of the active region 1, with the drop 24 as a boundary.

Device elements of the active region 1 and the edge termination region 2 are separated from one another by a portion (mesa edge of the drop 24, hereinafter, the third surface portion) 40c connecting the first surface portion 40a and the second surface portion 40b of the front surface of the semiconductor substrate 40. The second surface portion 40b of the front surface of the semiconductor substrate 40 is an exposed surface of the n$^-$-type silicon carbide layer 42 exposed during formation of the drop 24. During the formation of the drop 24, the n$^-$-type silicon carbide layer 42 may be slightly removed with the p-type silicon carbide layer 43. The third surface portion 40c of the front surface of the semiconductor substrate 40 is a side surface (exposed surface) of the p-type silicon carbide layer 43 exposed during the formation of the drop 24. Being exposed at the second and the third surface portions 40b, 40c of the front surface of the semiconductor substrate 40 means being in contact with the interlayer insulating film 19 on the second and the third surface portions 40b, 40c of the front surface of the semiconductor substrate 40.

The trench structure formed by the p-type base region (second semiconductor region) 13, n$^+$-type source regions (fourth semiconductor regions) 14, p$^{++}$-type contact regions 15, trenches 16, gate insulating films 17, and gate electrodes 18 is provided in the semiconductor substrate 40 at the first surface portion 40a of the front surface of the semiconductor substrate 40, in the center portion 1a of the active region 1. The n$^+$-type starting substrate 41 is the n$^+$-type drain region (first semiconductor region) 11. The n$^-$-type drift region (first semiconductor region) 12 is a portion of the n$^-$-type silicon carbide layer 42 excluding later-described first and second p$^+$-type regions 21, 22, an n-type current spreading region (not depicted), FLRs 31, and an n$^+$-type channel stopper region 32, and is provided between the n$^+$-type starting substrate 41 and these regions, the n$^-$-type drift region 12 being in contact with these regions and provided spanning the active region 1 and the edge termination region 2.

The p-type base region 13 is a portion of the p-type silicon carbide layer 43 excluding the n$^+$-type source regions 14 and the p$^{++}$-type contact regions 15. The p-type base region 13 is provided between the first surface portion 40a of the front surface of the semiconductor substrate 40 and the n$^-$-type drift region 12. The n$^+$-type source regions 14 and the p$^{++}$-type contact regions 15 are selectively provided between the first surface portion 40a of the front surface of the semiconductor substrate 40 and the p-type base region 13, are in contact with the p-type base region 13, and are exposed at the first surface portion 40a of the front surface of the semiconductor substrate 40. Being exposed at the first surface portion 40a of the front surface of the semiconductor substrate 40 means being in contact with a later-described source electrode 20 via contact holes of the later described interlayer insulating film 19.

The p$^{++}$-type contact regions 15 may be omitted. In this instance, instead of the p$^{++}$-type contact regions 15, the p-type base region 13 is exposed at the first surface portion 40a of the front surface of the semiconductor substrate 40. Between the n$^-$-type drift region 12 and the p-type base region 13, the n-type current spreading region (not depicted) that is a so-called current spreading layer (CSL) that reduces carrier spreading resistance may be provided at a deep position closer to the n$^+$-type drain region 11 than are bottoms of the trenches 16. Further, the first and the second p$^+$-type regions (first and second high-concentration regions) 21, 22 are provided at deep positions closer to the n$^+$-type drain region 11 than are the bottoms of the trenches 16.

The first and the second p$^+$-type regions 21, 22 have a function of mitigating electric field applied to the bottoms of the trenches 16. The first p$^+$-type regions 21 are provided apart from the p-type base region 13 and face the trenches 16 in a depth direction. The first p$^+$-type regions 21 are electrically connected to the source electrode 20 by a non-depicted portion. One of the second p$^+$-type regions 22 is provided between an adjacent two of the trenches 16, apart from the first p$^+$-type regions 21 and the trenches 16, and in contact with the p-type base region 13. The trenches 16 penetrate through the n$^+$-type source regions 14 and the p-type base region 13 in the depth direction and reach the n$^-$-type drift region 12 (in an instance in which the n-type current spreading region is provided, the n-type current spreading region).

The trenches 16, for example, extend in a stripe pattern in a direction parallel to the front surface of the semiconductor substrate 40 and reach a later-described peripheral portion 1b of the active region 1. The p-type base region 13, the n$^+$-type source regions 14, the p$^{++}$-type contact regions 15, and the second p$^+$-type regions 22 extend between adjacent trenches of the trenches 16 in a linear shape parallel to the trenches 16. The p$^{++}$-type contact regions 15 may be scattered parallel to the trenches 16. In the trenches 16, the gate electrodes 18 are provided via the gate insulating films 17. All the gate electrodes 18 are electrically connected via a gate runner (gate wiring layer, not depicted) of the peripheral portion 1b of the active region 1.

The interlayer insulating film 19 is provided on an entire area of the front surface of the semiconductor substrate 40, the interlayer insulating film 19 covering the gate electrodes 18 in the active region 1 and covering the front surface of the semiconductor substrate 40 in the peripheral portion 1b of the active region 1 and in the edge termination region 2. In the peripheral portion 1b of the active region 1 and in the edge termination region 2, a field oxide film may be provided between the front surface of the semiconductor substrate 40 and the interlayer insulating film 19. The source electrode (first electrode) 20, via contact holes of the interlayer insulating film 19, is in ohmic contact with the n$^+$-type source regions 14 and the p$^{++}$-type contact regions 15 and electrically connected to the p-type base region 13. A drain electrode (second electrode) 25 is provided in an entire area of the back surface (back surface of the n$^+$-type starting substrate 41) of the semiconductor substrate 40 and is electrically connected to the n$^+$-type drain region 11.

The peripheral portion 1b of the active region 1 surrounds a periphery of the center portion 1a of the active region 1 in substantially a rectangular shape. In the peripheral portion 1b of the active region 1, in an entire region between the first surface portion 40a of the front surface of the semiconductor substrate 40 and the n$^-$-type drift region 12, a p-type region (second-conductivity-type peripheral region) formed by the p+-type extension portion 22a, a p-type base extension portion 13a, and a p++-type contact extension portion 15a stacked sequentially from the n−-type drift region 12 is provided. The p+-type extension portion 22a, the p-type base extension portion 13a, and the p++-type contact extension portion 15a surround a periphery of the center portion 1a of the active region 1 in substantially a rectangular shape. The p+-type extension portion 22a, the p-type base extension portion 13a, and the p++-type contact extension portion 15a each has an end facing the chip end and exposed at the third surface portion 40c of the front surface of the semiconductor substrate 40.

The p+-type extension portion 22a, the p-type base extension portion 13a, and the p++-type contact extension portion 15a have a function of making electric field uniform in a plane of the first surface portion 40a of the front surface of the semiconductor substrate 40, in the peripheral portion 1b of the active region 1. The p+-type extension portion 22a, the p-type base extension portion 13a, and the p++-type contact extension portion 15a are regions for leading out hole current to the source electrode 20 and have a function of suppressing concentration of the hole current during avalanche breakdown in the edge termination region 2, the hole current being generated by the n−-type drift region 12 in the edge termination region 2 during an OFF state of the MOSFET and flowing toward the active region 1 from the p++-type contact extension portion 15a.

The p+-type extension portion 22a is an extended portion of the second p+-type region 22 of a unit cell closest to the chip end, of the unit cells in the center portion 1a of the active region 1. The p+-type extension portion 22a reaches a deep position closer to the n+-type drain region 11 than is the second surface portion 40b of the front surface of the semiconductor substrate 40. The p+-type extension portion 22a extends closer to the chip end than does the drop 24 and surrounds an entire perimeter of a boundary between the second surface portion 40b and the third surface portion 40c of the front surface of the semiconductor substrate 40. The p-type base extension portion 13a is an extended portion of the p-type base region 13. The p-type base extension portion 13a is provided between the first surface portion 40a of the front surface of the semiconductor substrate 40 and the p+-type extension portion 22a.

The p++-type contact extension portion 15a is an extended portion of the p++-type contact region 15 of the unit cell closest to the chip end, of the unit cells in the center portion 1a of the active region 1. The p++-type contact extension portion 15a is provided between the first surface portion 40a of the front surface of the semiconductor substrate 40 and the p-type base extension portion 13a. The p++-type contact extension portion 15a (in an instance in which the p++-type contact extension portion 15a is omitted, the p-type base extension portion 13a) is in ohmic contact with the source electrode 20 via a contact hole of the interlayer insulating film 19. The p+-type extension portion 22a and the p-type base extension portion 13a are electrically connected to the source electrode 20 via the p++-type contact extension portion 15a.

In the edge termination region 2, the n+-type channel stopper region 32 and multiple p+-type regions (FLRs: hatched portions) 31 having a floating potential and configuring the FLR structure 30 are selectively provided between the second surface portion 40b of the front surface of the semiconductor substrate 40 and the n−-type drift region 12. The FLR structure 30 has a function of mitigating electric field of the front side of the semiconductor substrate 40 and sustaining a breakdown voltage. The breakdown voltage is an upper limit voltage at which no erroneous operation or destruction of the silicon carbide semiconductor device 10 occurs by an operating voltage. The FLR structure 30 is divided into at least two FLR segments (later-described FLR segments 30a, 30b, 30c) at boundaries (later-described first and second points of change b1, b2) of predetermined FLRs 31 as described hereinafter.

The FLRs 31 are provided closer to the chip end than is the p+-type extension portion 22a, at positions apart from the p+-type extension portion 22a, the FLRs 31 being provided apart from one another concentrically surrounding a periphery of the active region 1. Of the FLRs 31, the FLR 31 closest to the chip center (first FLR 31 from the chip center) is adjacent to a chip-end-side of the p+-type extension portion 22a in the normal direction (direction from the chip center side to the chip outer side), the chip-end-side of the p+-type extension portion 22a facing the chip end. All the FLRs 31 are formed in the n−-type silicon carbide layer 42 by ion implantation and peripheries of the FLRs 31 are surrounded by the n−-type drift region 12. The n−-type drift region 12 is between the p+-type extension portion 22a and the FLR 31 closest to the chip center and between all the FLRs 31 adjacent to one another. Preferably, a total number of the FLRs 31, for example, may be at least about 30. All the FLRs 31 have a same impurity concentration and a same width (width in the normal direction, i.e., a direction from the chip center to the chip end) w1.

Preferably, the impurity concentration of the FLRs 31, for example, may be at least about $1\times10^{18}/cm^3$ at which complete depletion does not occur even when high voltage close to the breakdown voltage of the silicon carbide semiconductor device 10 is applied to pn junctions between the FLRs 31 and the n−-type drift region 12 and the impurity concentration may be at most about $1\times10^{21}/cm^3$. When the impurity concentration of the FLRs 31 exceeds the described upper limit, the width w1 of the FLRs 31 becomes too wide due to impurity diffusion, whereby the FLRs 31 become connected to one another and thus, is undesirable. The width w1 of the FLRs 31, for example, is in a range of about 2 μm to 5 μm. In FIG. 2, a first interval between the p+-type extension portion 22a and the FLR 31 closest to the chip center (first FLR 31 from the chip center) is assumed as $x_1$ while an n-th interval between an n-th one of the FLRs 31 and an (n−1)-th one of the FLRs 31 adjacent to the n-th one and closer to the chip center than is the n-th one is assumed as $x_n$, and subsequent intervals in a direction from the chip center to the chip end are assumed as $x_{n+1}$, . . . (where, n=2 to the total number of the FLRs 31). That is, each FLR has a first side and a second side opposite to each other, the first side is closer to the chip center than is the second side. An interval of two FLRs is a distance between one FLR and the other one that is the closest one from the second side of the one FLR.

Figure 11:
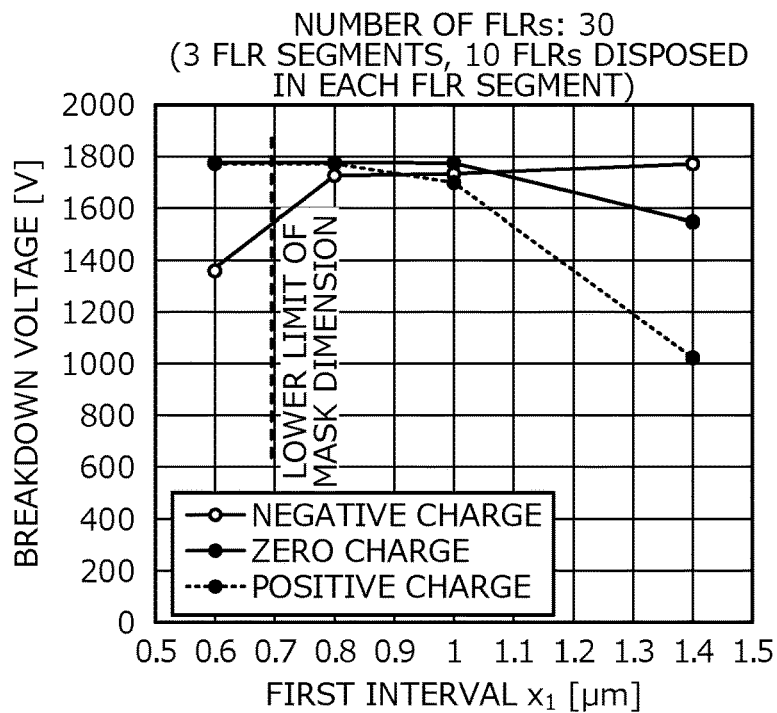
FIG. 11 is a characteristics diagram depicting results of simulation of breakdown voltage characteristics of a first examined example.
Figure 12:
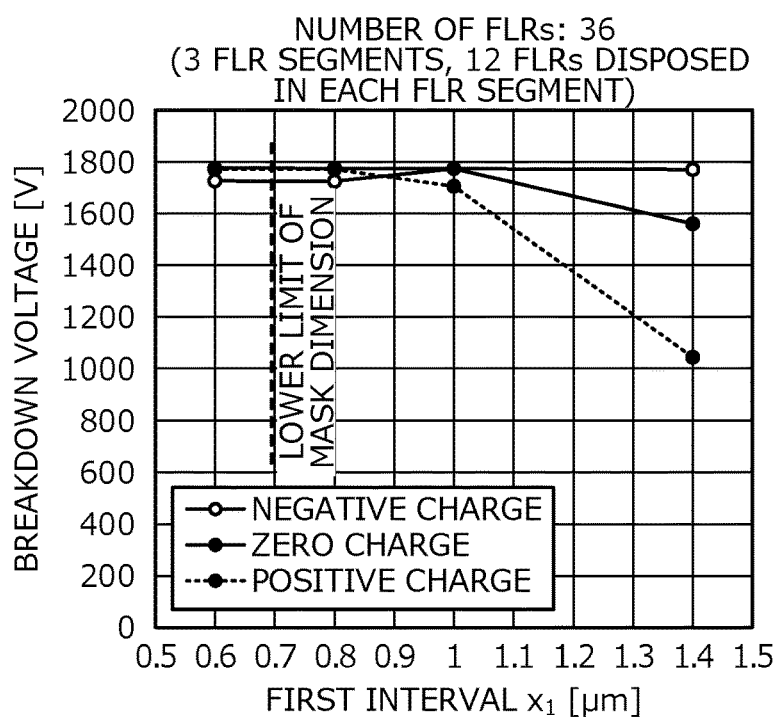
FIG. 12 is a characteristics diagram depicting results of simulation of breakdown voltage characteristics of a second examined examples.

The first interval $x_1$ between the p+-type extension portion 22a and the FLR 31 closest to the chip center, with consideration of impurity diffusion, for example, may be in a range of about 0.1 μm to 1.0 μm and preferably, for example, may be at least about 0.6 μm (refer to FIGS. 11 and 12). An n-th interval $x_n$ between an adjacent two of the FLRs 31 is wider than the first interval $x_1$ between the p+-type extension portion 22a and the FLR 31 closest to the chip center, and an n-th interval $x_n$ between an adjacent two of the FLRs 31 increases in arithmetic progression by a constant increase increment (width in the normal direction), the closer the adjacent two of the FLRs 31 are to the chip end, constant increase increments respectively corresponding to the FLR segments 30a to 30c. A width of the p+-type extension portion 22a and the width w1 of each of the FLRs 31 is wider than an opening width of an ion implantation mask by about 0.2 μm to 0.3 μm toward the chip center and toward the chip end due to impurity diffusion and therefore, an m-th interval $x_m$ (where, m=1 to the total number of the FLRs 31) is narrower than widths of portions left of the ion implantation mask (widths between openings).

An increase increment of an n-th interval $x_n$ between an adjacent two of the FLRs 31 is constant within each FLR segment into which the FLRs 31 are divided having at least one of the FLRs 31 as a boundary, the increase increment being wider in FLR segments disposed closer to the chip end than in FLR segments disposed relatively closer to the chip center. In particular, for example, in an instance in which the increase increment of an n-th interval $x_n$ between an adjacent two of the FLRs 31 is changed at two of the FLRs 31 set as boundaries (the first and the second points of change b1, b2 sequentially from the chip center side to the chip outer side), the FLR structure 30 is divided into three FLR segments (indicated by reference characters 30a to 30c in a direction from the chip center side to the chip outer side). The increase increment of an n-th interval $x_n$ between an adjacent two of the FLRs 31 is wider in the FLR segment 30b that is between the first and the second points of change b1, b2 than in the FLR segment 30a that is closer to the chip center than is the first point of change b1 (closest to the chip center), the FLR segment 30b being adjacent to the FLR segment 30a and closer to the chip end than is the FLR segment 30a.

The increase increment of an n-th interval $x_n$ between an adjacent two of the FLRs 31 is wider in the FLR segment 30c than in the FLR segment 30b between the first and the second points of change b1, b2, the FLR segment 30c being closer to the chip end than is the second point of change b2 that is adjacent to the FLR segment 30b on a side thereof facing the chip end. In the respective FLR segments 30a to 30c, the increase increment of an n-th interval $x_n$ between an adjacent two of the FLRs 31 is constant ($x_{n+1}-x_n$=constant). In the respective FLR segments 30a to 30c, an n-th interval $x_n$ between an adjacent two of the FLRs 31 increases in arithmetic progression by the constant increase increment, the closer the adjacent two of the FLRs 31 are to the chip end. Preferably, the increase increment of an n-th interval $x_n$ between an adjacent two of the FLRs 31, for example, may be in a range of about 0.05 μm to 0.12 μm (refer to FIGS. 7, 8, and 11).

The first point of change b1 (closest to the chip center) of the increase increment of an n-th interval $x_n$ between an adjacent two of the FLRs 31 is set to a second one or a subsequent one of the FLRs 31 in the direction from the chip center side to the chip outer side, the second one being second from the chip center and assumed as a lower limit. Therefore, the FLR segment (first FLR segment) 30a closest to the chip center includes at least a portion having the first interval $x_1$ between the p$^+$-type extension portion 22a and the FLR 31 closest to the chip center and a portion having a second interval $x_2$ between a first one of the FLRs 31 and the second one adjacent thereto of the FLRs 31. A FLR segment (second FLR segment, here, the FLR segment 30b) closer to the chip end than is the first point of change b1 includes a portion having n-th intervals $x_n$ of a third one (third interval $x_3$ between the second one of the FLRs 31 and an adjacent third one of the FLRs 31) and subsequent ones in a direction from the chip center side to the chip outer side.

The point of change (closest to the chip end, here, the second point of change b2) of the increase increment of an n-th interval $x_n$ between an adjacent two of the FLRs 31 is set to be a third one of the FLRs 31, third from the chip end (here, for example, a 28-th one of the FLRs 31 assuming a total of 30 of the FLRs 31) and subsequent ones in a direction from the chip outer side to the chip center side, the third FLR 31 from the chip end being assumed as an upper limit. Therefore, a FLR segment closest to the chip end (third FLR segment, here, the FLR segment 30c) includes at least two n-th intervals $x_n$ from the chip end (for example, 29-th and 30-th intervals $x_{29}$, $x_{30}$), and a FLR segment (second FLR segment, here, the FLR segment 30b) closer to the chip center than is the point of change closest to the chip end includes a portion having a third one from the chip end (for example, a 28-th interval $x_{29}$) and subsequent n-th intervals $x_n$ in the direction from the chip end to the chip center.

Preferably, the FLR structure 30 may be divided into at least three FLR segments. A same number of n-th intervals $x_n$ may be included in each of the FLR segments of the FLR structure 30 (the number in the FLR segment 30a closest to the chip center includes the first interval $x_1$ between the p$^+$-type extension portion 22a and the FLR 31 closest to the chip center). A reason for this is that a manner in which a depletion layer spreads in the n$^-$-type drift region 12, from main junctions (pn junctions between the p-type base region 13, the first and the second p$^+$-type regions 21, 22, the p$^+$-type extension portion 22a, and the n$^-$-type drift region 12) of the active region 1 to the chip end may be suitably set (adjusted) for a chip center side, a center, and a chip outer side of the FLR structure 30.

When an insulating layer (field oxide film and the interlayer insulating film 19) covering the second surface portion 40b of the front surface of the semiconductor substrate 40 becomes positively charged due to long periods of operation of the silicon carbide semiconductor device 10, the spreading of the depletion layer in the n$^-$-type drift region 12 is suppressed due to positive charge in the insulating layer, whereby concentration of electric field in the edge termination region 2 at a portion thereof nearest the chip center is distributed by a FLR segment of the FLR structure 30 closer to the chip center (here, the FLR segment 30a). When the insulating layer covering the second surface portion 40b of the front surface of the semiconductor substrate 40 is negatively charged due to long periods of operation of the silicon carbide semiconductor device 10, the spreading of the depletion layer in the n$^-$-type drift region 12 to the chip outer side is facilitated due to the negative charge in the insulating layer, whereby voltage decreases that occur are suppressed by a FLR segment of the FLR structure 30 closer to the chip end (here, the FLR segment 30c).

Normally when the insulating layer covering the second surface portion 40b of the front surface of the semiconductor substrate 40 is not charged (zero charge), spreading of the depletion layer in the n$^-$-type drift region 12 to the chip end may be facilitated by a FLR segment (here, the FLR segment 30b) near a center of the FLR structure 30 and the load of the breakdown voltage near the center of the edge termination region 2 may be distributed. An example of dimensions of an m-th interval $x_m$ described above (where, m=1 to the total number of the FLRs 31) are shown in FIG. 3 as the widths of the portions left of the ion implantation mask (widths between openings) for forming the p$^+$-type extension portion 22a and the FLRs 31. In FIG. 3, "No." indicates the number of the FLRs 31 from the chip center. In FIG. 3, the total number of the FLRs 31 is 30 and a 10-th one and a 20-th one of the FLRs 31 from the chip center are the first and the second points of change b1, b2 of the increase increment for an m-th interval $x_m$.

The FLR segment 30a closest to the chip center extends between and includes the first interval $x_1$ between the $p^+$-type extension portion 22a and the FLR 31 closest to the chip center, and a 10-th interval $x_{10}$ between a 9-th one and a 10-th one adjacent thereto of the FLRs 31. The first interval $x_1$, for example, is assumed to be 1 μm and in the FLR segment 30a closest to the chip center, the increase increment of an n-th interval $x_n$ between an adjacent two of the FLRs 31 is assumed to be 0.05 μm. In this instance, the second interval $x_2$ between the first one and the second one adjacent thereto of the FLRs 31 is 1.05 μm (=1 μm+0.05 μm), an n-th interval $x_n$ between an adjacent two of the FLRs 31 increases in arithmetic progression by the constant increase increment of 0.05 μm, the closer the adjacent two of the FLRs 31 are to the chip end, and the 10-th interval $x_{10}$ that is closest to the chip end in the FLR segment 30a and between the 9-th one and the 10-th one adjacent thereto of the FLRs 31 is 1.45 μm (=1 μm+0.05 μm×9).

The FLR segment 30b between the first and the second points of change b1, b2 extends between and includes an 11-th interval $x_{11}$ between the 10-th one and an 11-th one adjacent thereto of the FLRs 31, and a 20-th interval $x_{20}$ between a 19-th one and a 20-th one adjacent thereto of the FLRs 3. The increase increment of an n-th interval $x_n$ between an adjacent two of the FLRs 31 in the FLR segment 30b between the first and the second points of change b1, b2 is greater than that in the FLR segment 30a closest to the chip center and is assumed to be 0.08 μm. In this instance, the 11-th interval $x_{11}$ between the 10-th one and the 11-th one adjacent thereto of the FLRs 31 is 1.53 μm (=1.45 μm+0.08 μm), an n-th interval $x_n$ between an adjacent two of the FLRs 31 increases in arithmetic progression by the constant increase increment of 0.08 μm, the closer the adjacent two of the FLRs 31 are to the chip end, and the 20-th interval $x_{20}$ that is closest to the chip end in the FLR segment 30b and between the 19-th one and the 20-th one adjacent thereto of the FLRs 31 is 2.25 μm (=1.45 μm+0.08 μm×10).

The FLR segment 30c closest to the chip end extends between and includes a 21-st interval $x_{21}$ between the 20-th one and a 21-st one adjacent thereto of the FLRs 31, and a 30-th interval $x_{30}$ between a 29-th one and a 30-th one adjacent thereto of the FLRs 31. The increase increment of an n-th interval $x_n$ between an adjacent two of the FLRs 31 is greater in the FLR segment 30c closest to the chip end than that in the FLR segment 30b between the first and the second points of change b1, b2 and is assumed to be 0.12 μm. In this instance, the 21-st interval $x_{21}$ between the 20-th one and the 21-st one adjacent thereto of the FLRs 31 is 2.37 μm (=2.25 μm+0.12 μm), an n-th interval $x_n$ between an adjacent two of the FLRs 31 increases in arithmetic progression by the constant increase increment of 0.12 μm, the closer the adjacent two of the FLRs 31 are to the chip end, and the 30-th interval $x_{30}$ that is closest to the chip end in the FLR segment 30c and between the 29-th one and the 30-th one adjacent thereto of the FLRs 31 is 3.45 μm (=2.25 μm+0.12 μm×10).

Even when the insulating layer covering the second surface portion 40b of the front surface of the semiconductor substrate 40 is charged positively or negatively, it suffices to be able to set the manner in which the depletion layer spreads in the $n^-$-type drift region 12 so as to obtain breakdown voltage characteristics that are substantially the same as breakdown voltage characteristics in a normal state of the insulating layer having zero charge, and the number of the FLR segments and the number of n-th intervals $x_n$ in each of the FLR segments of the FLR structure 30 may be suitably changed. Therefore, in an instance in which the total number of the FLRs 31 is 30 and the number of n-th intervals $x_n$ in the FLR segment close to the center of the FLR structure 30 is assumed to be relatively high, for example, 20, it suffices to be able to secure the predetermined breakdown voltage of the edge termination region 2 when the insulating layer covering the second surface portion 40b of the front surface of the semiconductor substrate 40 is not charged.

In the FLR segments respectively closest to the chip center and the chip end of the FLR structure 30, the number of n-th intervals $x_n$ in each is assumed to be 5, the remaining intervals. Further, of the FLR structure 30, in the FLR segment closest to the chip center, an n-th interval $x_n$ between an adjacent two of the FLRs 31 increases in arithmetic progression by the constant increase increment, the closer the adjacent two of the FLRs 31 are to the chip end, whereby spreading of the depletion layer in the chip center side of the edge termination region 2 to the outer side thereof may be facilitated and concentration of electric field in the chip center side of the edge termination region 2 due to positive charge in the insulating layer may be distributed. In the FLR structure 30, in the FLR segment closest to the chip end, an interval between an adjacent two of the FLRs decreases in arithmetic progression by the constant increase increment, the closer the adjacent two FLRs are disposed to the chip center, whereby spreading of the depletion layer in the outer side of the edge termination region 2 to the chip outer side may be suppressed and breakdown voltage decreases due to negative charge in the insulating layer may be suppressed.

All the FLRs 31 are disposed at a same depth and have a same thickness. While all the FLRs 31 may reach and be exposed at the second surface portion 40b of the front surface of the semiconductor substrate 40 (not depicted), preferably, all the FLRs 31 may be disposed deeper than the second surface portion 40b of the front surface of the semiconductor substrate 40 (FIG. 2). In other words, a portion of the $n^-$-type drift region (third semiconductor region) 12 having a predetermined thickness t1 may be present between the second surface portion 40b of the front surface of the semiconductor substrate 40 and all the FLRs 31. The FLRs 31 are apart from the second surface portion 40b of the front surface of the semiconductor substrate 40, whereby adverse effects of charge in the insulating layer covering the second surface portion 40b of the front surface of the semiconductor substrate 40 may be mitigated, the charge being due to long operation periods of the silicon carbide semiconductor device 10.

The thickness t1 of the portion of the $n^-$-type drift region 12 between the second surface portion 40b of the front surface of the semiconductor substrate 40 and the FLRs 31 may be, for example, about 0.4 μm with consideration of etching depth variation (about 0.2 μm) in forming the drop 24. The FLRs 31 may be formed concurrently with the first $p^+$-type regions 21 of the active region 1. The FLRs 31 and the $p^+$-type extension portion 22a are disposed at the same depth, whereby electric field concentration at the chip-end-side of the $p^+$-type extension portion 22a is suppressed. Further, by forming the FLRs 31 concurrently with only the first $p^+$-type regions 21, a predetermined thickness (dimension in the depth direction) of the FLRs 31 may be stably ensured without being affected by etching depth variation in forming the drop 24.

The $n^+$-type channel stopper region 32 is apart from the FLR structure 30 and disposed closer to the chip end than is the FLR structure 30. The $n^+$-type channel stopper region 32 is exposed at the second surface portion 40b of the front surface of the semiconductor substrate 40 and at the chip end. The n+-type channel stopper region 32 has a floating potential. The n+-type channel stopper region 32 surrounds a periphery of the n−-type drift region 12, and the n−-type drift region 12 is between the n+-type channel stopper region 32 and the FLR 31 closest to the chip end. The n+-type channel stopper region 32, for example, may have a same impurity concentration as that of the n+-type source regions 14. The second surface portion 40b of the front surface of the semiconductor substrate 40 is free of a field plate (FP) and a channel stopper electrode.

Operation of the silicon carbide semiconductor device 10 according to the embodiment is described. When voltage at least equal to a gate threshold voltage is applied to the gate electrodes 18 while voltage that is positive with respect to the source electrode 20 (forward voltage) is applied to the drain electrode 25, a channel (n-type inversion layer) is formed along the trenches 16 of the p-type base region 13. As a result, current flows from the n+-type drain region 11, passes through the n−-type drift region 12 and a channel (n-type inversion layer formed along sidewalls of the trenches 16 in the p-type base region 13) to the n+-type source regions 14, and the MOSFET (the silicon carbide semiconductor device 10) turns ON.

On the other hand, when voltage less than the gate threshold voltage is applied to the gate electrodes 18 while the forward voltage is applied between a source and drain, in the active region 1, pn junctions (main junctions of the active region 1) between the p-type base region 13, the first and the second p+-type regions 21, 22, the p+-type extension portion 22a, and the n−-type drift region 12 are reverse biased, whereby the MOSFET maintains an OFF state. Here, a depletion layer spreads in the n−-type drift region 12, from the pn junctions to the n+-type drain region 11, whereby electric field applied to the gate insulating films 17 at the bottoms of the trenches 16 positioned closer to the source electrode 20 than are the pn junctions is mitigated.

Figure 13:
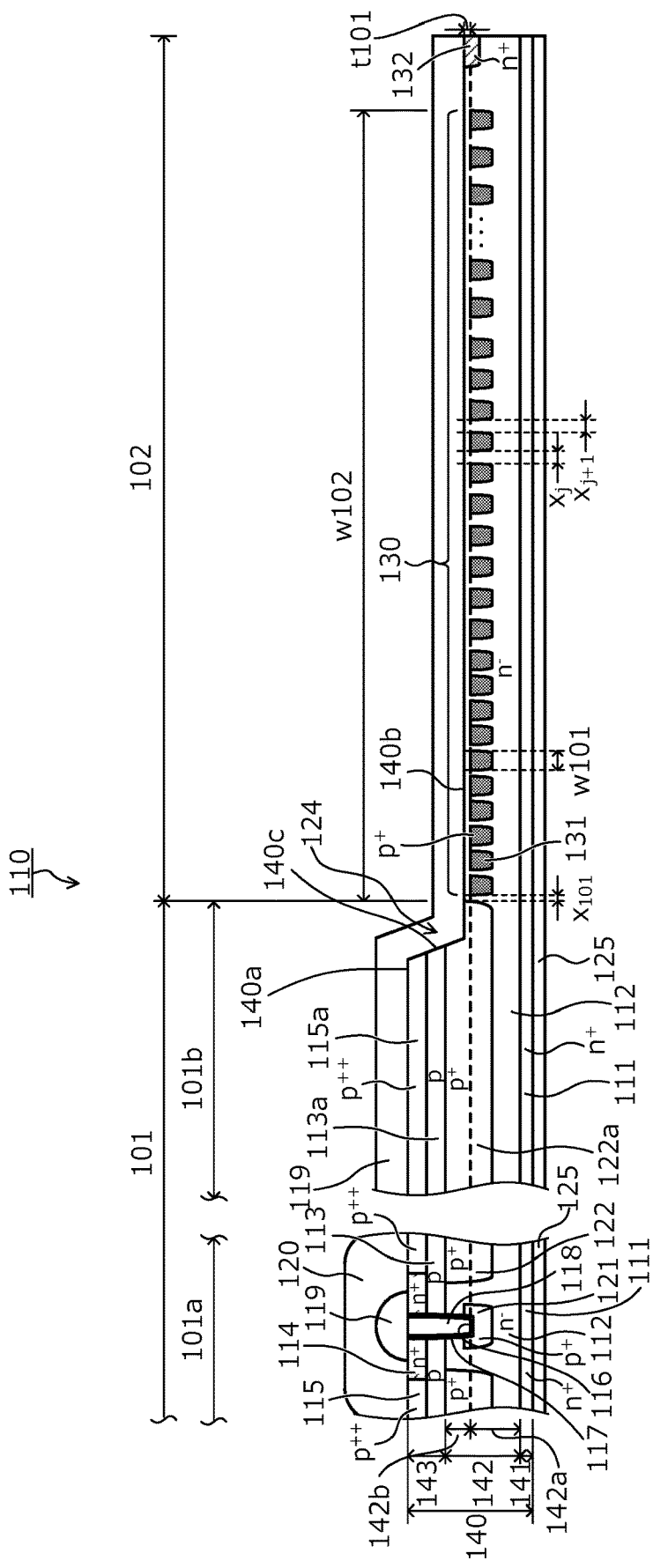
FIG. 13 is a cross-sectional view depicting a structure of a conventional silicon carbide semiconductor device.

Further, when the MOSFET is OFF, the predetermined breakdown voltage based on breakdown field strength of silicon carbide and depletion layer width (width in the normal direction) may be ensured for an extent that the depletion layer in the n−-type drift region 12 extends in the edge termination region 2 to the chip outer side (chip end). In the embodiment, an n-th interval $x_n$ between an adjacent two of the FLRs 31 of the FLR structure 30 increases in arithmetic progression by the constant increase increment, the closer the adjacent two of the FLRs 31 are to the chip end, whereby the predetermined breakdown voltage about the same as that of the conventional structure may be stably obtained even when a width w2 of the edge termination region 2 is shorter than a width w102 of the edge termination region 102 of the conventional structure (FIG. 13).

Figure 4:
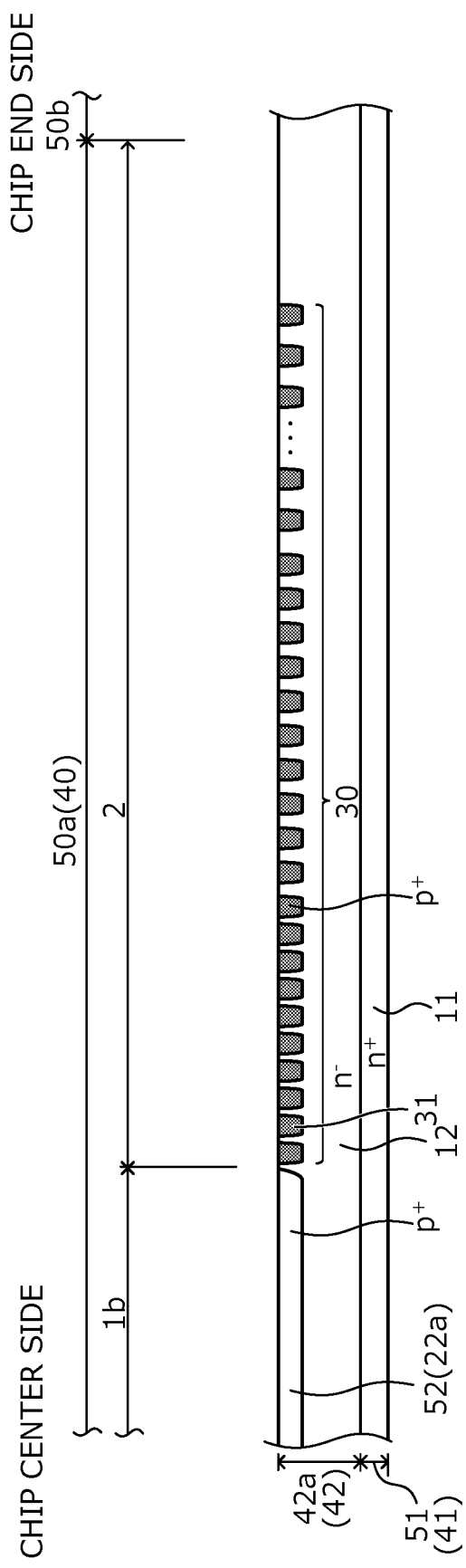
FIG. 4 is a cross-sectional views of a state of a silicon carbide semiconductor device according to the embodiment during manufacture.
Figure 5:
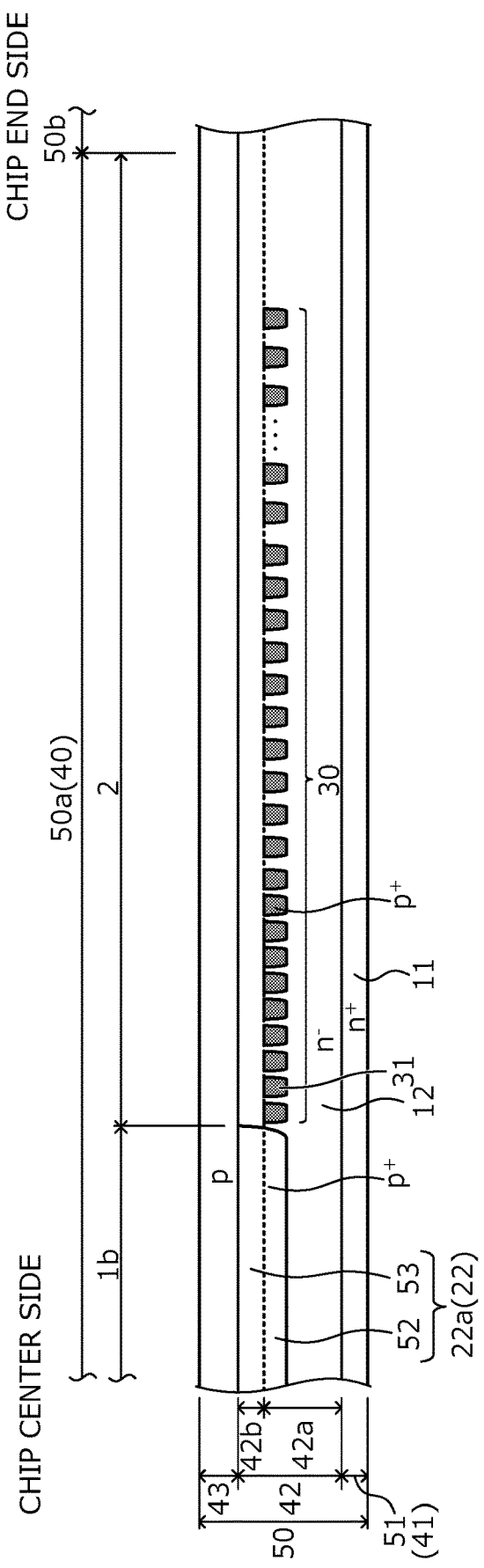
FIG. 5 is a cross-sectional views of a state of the silicon carbide semiconductor device according to the embodiment during manufacture.
Figure 6:
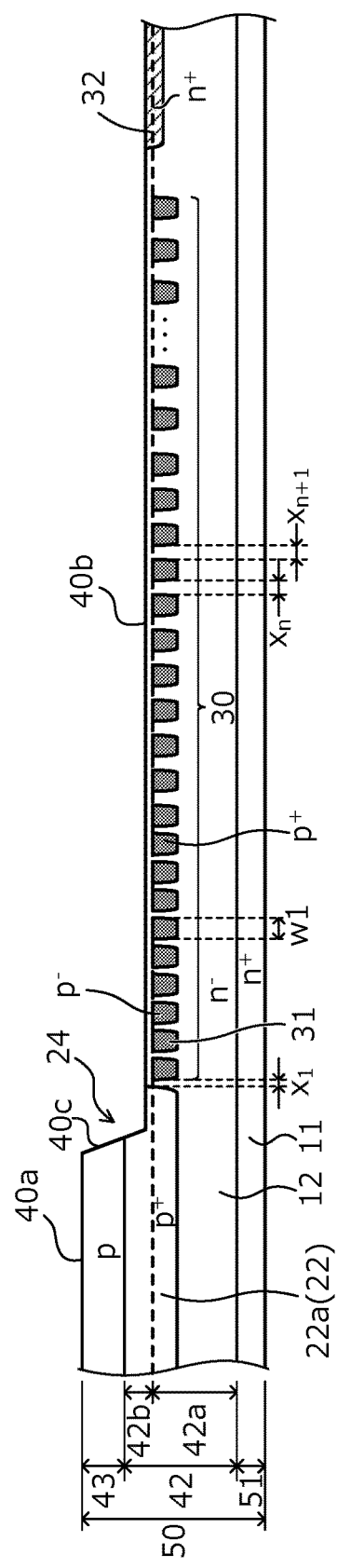
FIG. 6 is a cross-sectional views of a state of the silicon carbide semiconductor device according to the embodiment during manufacture.

Next, a method of manufacturing the silicon carbide semiconductor device 10 according to the embodiment is described. FIGS. 4, 5, and 6 are cross-sectional views of states of the silicon carbide semiconductor device according to the embodiment during manufacture. In FIGS. 4 to 6, the peripheral portion 1b of the active region 1 of only one of multiple chip regions 50a and the edge termination region 2 (refer to FIG. 2) are depicted, and the center portion 1a of the active region 1 is described with reference to FIG. 2. Each of the chip regions 50a is a region constituting a semiconductor chip (the semiconductor substrate 40) after a semiconductor wafer 50 is diced (cut), the chip regions 50a being formed in a center portion of the semiconductor wafer 50, for example, in a matrix-like pattern, surrounded by dicing lines (cutting lines) 50b of a grid pattern.

First, as depicted in FIG. 4, on a front surface of an n+-type starting wafer 51 constituting the n+-type starting substrate 41, an n−-type silicon carbide layer (first first-conductivity-type semiconductor layer) 42a constituting the n−-type drift region 12 is epitaxially grown (first process). Next, the first p+-type regions 21 of the center portion 1a of the active region 1, lower portions (fourth portions) of the second p+-type regions 22 of the center portion 1a of the active region 1, a lower portion (first portion) 52 of the p+-type extension portion 22a of the peripheral portion 1b of the active region 1, and all the FLRs 31 of the FLR structure 30 of the edge termination region 2 are selectively formed in surface regions of the n−-type silicon carbide layer 42a, by photolithography and ion implantation of a p-type impurity, using a single ion implantation mask (second process).

The FLRs 31 of the FLR structure 30 are formed concurrently with the first p+-type regions 21, whereby a separate ion implantation process for forming the FLRs 31 becomes unnecessary and the number of processes may be reduced. Further, other regions (the first p+-type regions 21, lower portions of the second p+-type regions 22, and the p+-type extension portion 22a) and the FLRs 31 are formed concurrently by the same ion implantation mask, whereby the number of ion implantation masks may be reduced and manufacturing cost may be reduced. Further, the FLRs 31 of the FLR structure 30 are formed concurrently with the lower portion 52 of the p+-type extension portion 22a, whereby the FLRs 31 may be disposed at the same depth as that of the p+-type extension portion 22a.

Next, as depicted in FIG. 5, the ion implantation mask (not depicted) used in forming the first p+-type regions 21, etc. is removed and thereafter, an n−-type silicon carbide layer (second first-conductivity-type semiconductor layer) 42b is further epitaxially grown on the n−-type silicon carbide layer 42a, thereby increasing the thickness (third process), whereby the n−-type silicon carbide layer 42 (42a, 42b) having a product (the silicon carbide semiconductor device 10) thickness is formed. Next, in the center portion 1a of the active region 1, upper portions (fifth portions) of the second p+-type regions 22 are formed in the n−-type silicon carbide layer 42b, by photolithography and ion implantation of a p-type impurity. The upper portions and the lower portions of the second p+-type regions 22 are continuous in the depth direction, whereby the second p+-type regions 22 are formed.

In the peripheral portion 1b of the active region 1, an upper portion (second portion) 53 of the p+-type extension portion 22a is formed in the n−-type silicon carbide layer 42b concurrently with the upper portions of the second p+-type regions 22 (fourth process). The upper portion 53 and the lower portion 52 of the p+-type extension portion 22a are continuous in the depth direction, whereby the p+-type extension portion 22a is formed. Ion implantation is not performed in the n−-type silicon carbide layer 42b in the edge termination region 2. Therefore, in the edge termination region 2, all the FLRs 31 are covered by the n−-type silicon carbide layer 42b left as the n−-type drift region 12. Next, at the surface of the n−-type silicon carbide layer 42, the p-type silicon carbide layer 43 constituting the p-type base region 13 is epitaxially grown (fifth process).

By the processes up to here, the semiconductor wafer 50 in which the silicon carbide layers 42, 43 constituting the n−-type drift region 12 and the p-type base region 13 are epitaxially grown on the front surface of the n+-type starting wafer 51 is completed. In an instance in which the n-type current spreading region (not depicted) is formed, in an entire area of the active region 1, lower and upper portions of the n-type current spreading region are respectively formed in the n⁻-type silicon carbide layers 42a, 42b so as to be continuous in the depth direction, by photolithography and ion implantation of an n-type impurity performed for each epitaxial growth of the n⁻-type silicon carbide layers 42a, 42b constituting the n⁻-type drift region 12.

Next, as depicted in FIG. 6, by photolithography and etching, a portion of the p-type silicon carbide layer 43 in the edge termination region 2 is removed and the p-type silicon carbide layer 43 is left only in the active region 1. As a result, at the front surface of the semiconductor wafer 50, the drop 24 where a portion closer to the chip end (the second surface portion 40b) than is a portion closer to the chip center is lower (recessed) toward the n⁺-type starting wafer 51 is formed and in the edge termination region 2, the n⁻-type silicon carbide layer 42b is exposed at the second surface portion 40b of the front surface of the semiconductor wafer 50. A surface region of the n⁻-type silicon carbide layer 42b exposed at the second surface portion 40b of the front surface of the semiconductor wafer 50 may be slightly removed.

For example, in an instance in which the FLRs 31 are formed in the n⁻-type silicon carbide layer 42b, a surface region of the n⁻-type silicon carbide layer 42b is slightly removed by the etching for forming the drop 24, whereby the thickness of the FLRs 31 changes. On the other hand, as described above, the FLRs 31 are formed only in the n⁻-type silicon carbide layer 42a and the n⁻-type silicon carbide layer 42b is free of the FLRs 31, therefore, even when a surface region of the n⁻-type silicon carbide layer 42b is slightly removed during formation of the drop 24, the FLRs 31 may be left having a predetermined thickness. Further, the n⁻-type silicon carbide layer 42b constituting the n⁻-type drift region 12 may be left on the FLRs 31.

Next, the etching mask (not depicted) used to partially remove the p-type silicon carbide layer 43 is removed. Next, a process including photolithography, ion implantation, and ion implantation mask (not depicted) removal as one set is repeatedly performed under different conditions, whereby in surface regions of the semiconductor wafer 50, at the front surface thereof (main surface having the p-type silicon carbide layer 43), the n⁺-type source regions 14, the p⁺⁺-type contact regions 15, and the p⁺⁺-type contact extension portion 15a are selectively formed in the p-type silicon carbide layer 43. A sequence in which the n⁺-type source regions 14 and the p⁺⁺-type contact regions 15 are formed may be interchanged.

Concurrently with the formation of the n⁺-type source regions 14, in a surface region (surface region of the n⁻-type silicon carbide layer 42) of the semiconductor wafer 50, at the second surface portion 40b of the front surface thereof, the n⁺-type channel stopper region 32 may be selectively formed straddling between ends of the chip regions 50a adjacent to one another. A portion of the n⁻-type silicon carbide layer 42 (42a, 42b) excluding the first and the second p⁺-type regions 21, 22, the p⁺-type extension portion 22a, the FLRs 31, and the n⁺-type channel stopper region 32 constitutes the n⁻-type drift region 12. A portion of the p-type silicon carbide layer 43 excluding the n⁺-type source regions 14, the p⁺⁺-type contact regions 15, and the p⁺⁺-type contact extension portion 15a constitutes the p-type base region 13 and the p-type base extension portion (third portion) 13a.

Next, ion-implanted impurities are activated by a heat treatment. Next, by a general method, the trenches 16, the gate insulating films 17, the gate electrodes 18, the interlayer insulating film 19, the source electrode 20 (sixth process), the drain electrode 25 (seventh process), and a passivation film (polyimide protective film, not depicted) are formed. Next, portions of the passivation film on the dicing lines 50b are removed. Thereafter, the semiconductor wafer 50 is diced along the dicing lines 50b, whereby the chip regions 50a are formed into individual semiconductor chips (the semiconductor substrate 40) and the silicon carbide semiconductor device 10 in FIGS. 1 and 2 is completed.

As described above, according to the embodiment, the FLR structure configured by multiple FLRs each having a floating potential surrounding a periphery of the active regions is provided in the edge termination region. The FLR structure is divided into at least two FLR segments with a predetermined FLR as a boundary. The interval between an adjacent two of the FLRs increases in arithmetic progression by a constant increase increment, the closer the adjacent two FLRs are to the chip end, the constant increase increments respectively corresponding to the FLR segments, and the increase increment for a corresponding FLR segment is greater, the closer the FLR segment is to the chip end. As a result, the length of the edge termination region may be reduced, margins for dimension variation of the ion implantation mask may be taken, and variation of the breakdown voltage due to charge in the insulating layer on the surface of the semiconductor substrate in the edge termination region may be suppressed, the charge being due to long periods of operation.

Further, according to the embodiment, the length of the edge termination region is reduced, whereby increases in material cost may be suppressed. Further, according to the embodiment, the voltage withstanding structure is assumed to be a FLR structure, whereby the voltage withstanding structure may be formed by a single ion implantation process using one ion implantation mask, the number of masks and the number of processes may be reduced compared to an instance in which the voltage withstanding structure is a JTE structure, and manufacturing cost may be suppressed. Further, the FLRs are formed concurrently with the first p-type regions of the active region, whereby the number of masks and the number of processes may be further reduced. Therefore, a low-cost silicon carbide semiconductor device having a voltage withstanding structure capable of stably ensuring the predetermined breakdown voltage and formed by fewer processes may be provided.

Breakdown voltage characteristics of the silicon carbide semiconductor device 10 according to the embodiment described above (hereinafter, first and second examined examples, refer to FIG. 2) were verified. FIGS. 7, 8, 9, and 10 are characteristics diagrams depicting results of simulation of breakdown voltage characteristics of a conventional example. FIGS. 11 and 12 are characteristics diagrams depicting results of simulation of breakdown voltage characteristics of the first and the second examined examples, respectively. In the first examined example, the FLR structure 30 is divided into the FLR segments 30a to 30c under the dimension conditions in FIG. 3 described above. In the second examined example, the total number of the FLRs 31 is different from that in the first examined example. In the first and the second examined examples, the impurity concentration of the FLRs 31 and the width w1 were assumed to be $1\times10^{18}/cm^3$ and 3 µm, respectively. The thickness t1 of the portion of the n⁻-type drift region 12 between the second surface portion 40b of the front surface of the semiconductor substrate 40 and the FLRs 31 was assumed to be 0.2 µm.

For comparison, reliability of the breakdown voltage of the edge termination region 102 of the conventional silicon carbide semiconductor device 110 (hereinafter, the conventional example, refer to FIG. 13) was verified. The conventional example differs from the first examined example in that the general FLR structure 130 is provided in the edge termination region 102. Accordingly, in the conventional example, the FLR structure 130 is not divided into FLR segments, the increase increment of an i-th interval $x_j$ between an adjacent two of the FLRs 131 is constant in the entire region of the FLR structure 130 (where, i=2 to the total number of the FLRs 131, j=i+100). In the conventional example, the impurity concentration of the FLRs 131, the width w101 of the FLRs 131, and the thickness t101 of the n$^-$-type drift region 112 between the second surface portion 140b of the front surface of the semiconductor substrate 140 and the FLRs 131 were the same as those in the first examined example.

Figure 7:
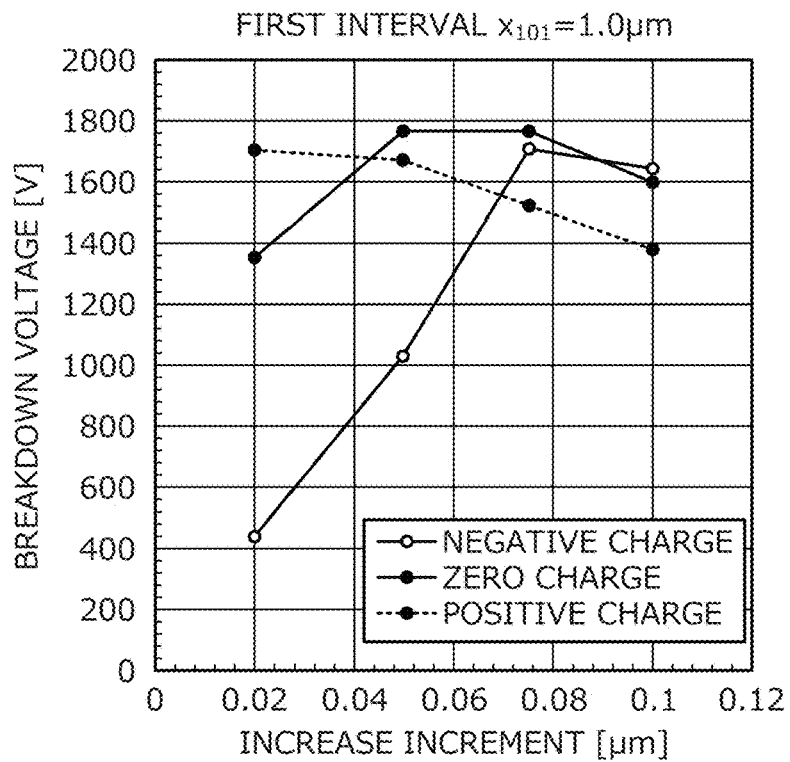
FIG. 7 is a characteristics diagram depicting results of simulation of breakdown voltage characteristics of a conventional example.
Figure 8:
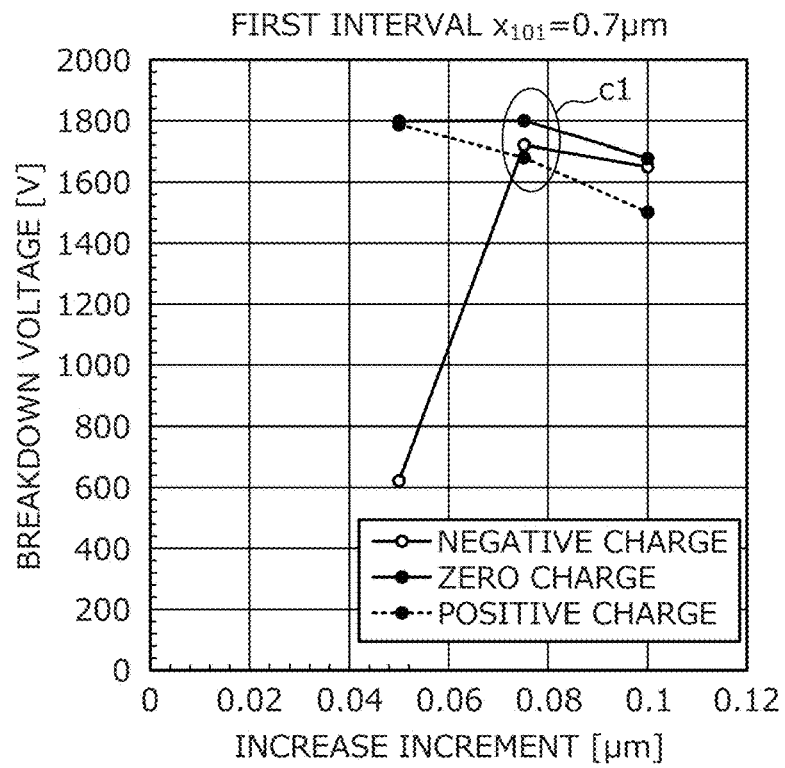
FIG. 8 is a characteristics diagram depicting results of simulation of breakdown voltage characteristics of the conventional example.

First, breakdown voltage characteristics of the edge termination region 102 of the conventional example are described. The increase increment (horizontal axis) of an i-th interval $x_j$ between an adjacent two of the FLRs 131 of the FLR structure 130 of the conventional example was variously changed, and results of simulation of a breakdown voltage BVdss (vertical axis) of the edge termination region 102 are shown in FIGS. 7 and 8. FIGS. 7 and 8 respectively show instances in which the first interval $x_{101}$ between the p$^+$-type extension portion 122a and the FLR 131 closest to the chip center was assumed to be 1.0 μm and 0.7 μm. In the conventional example in FIGS. 7 and 8, the total number of the FLRs 131 was assumed to be 30. FIGS. 7 and 8 show an instance in which the insulating layer (field oxide film and the interlayer insulating film 119) covering the second surface portion 140b of the front surface of the semiconductor substrate 140 is charged positively (positive charge is accumulated), an instance in which the insulating layer is negatively charged (negative charge is accumulated), and a normal state when the insulating layer is not charged (zero charge) (similarly in FIGS. 9 and 10).

From the results in FIGS. 7 and 8, in the conventional example, breakdown voltage variation was confirmed to occur due to charge accumulated in the insulating layer covering the second surface portion 140b of the front surface of the semiconductor substrate 140 (hereinafter, simply "insulating layer"), the accumulated charge being due to long periods of operation under a high temperature. In particular, in a setting in which the increase increment of an i-th interval $x_j$ between an adjacent two of the FLRs 131 is reduced (origin-side of horizontal axis), when the insulating layer is negatively charge, the breakdown voltage tends to decrease compared to the normal state. In a setting in which the increase increment of an i-th interval $x_j$ between an adjacent two of the FLRs 131 is increased (side apart from origin of horizontal axis), when the insulating layer is positively charged, the breakdown voltage tends to decrease compared to the normal state. Further, for a setting in which the increase increment of an i-th interval $x_j$ between an adjacent two of the FLRs 131 is assumed to be 0.075 μm, while the breakdown voltage characteristics are the most stable, for all the settings in FIGS. 7 and 8, compared to the normal state, breakdown voltage variation of at least 100V occurred.

Figure 9:
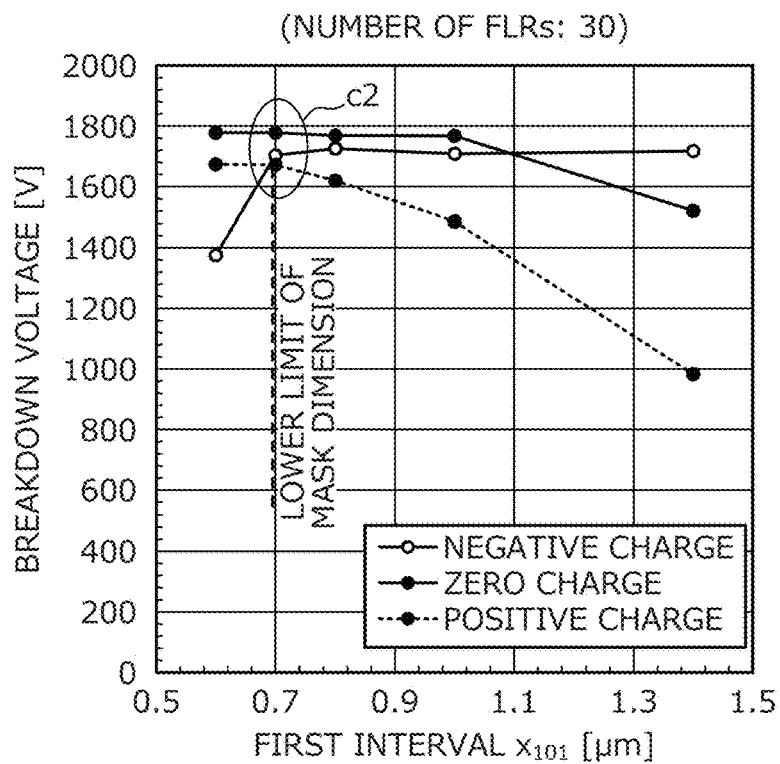
FIG. 9 is a characteristics diagram depicting results of simulation of breakdown voltage characteristics of the conventional example.
Figure 10:
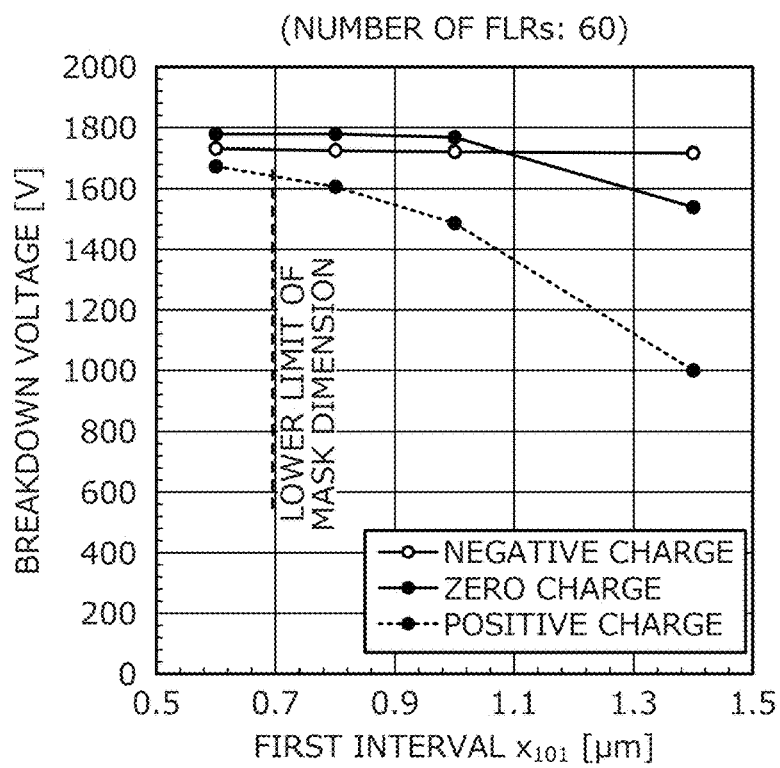
FIG. 10 is a characteristics diagram depicting results of simulation of breakdown voltage characteristics of the conventional example.

Thus, results of simulation of the breakdown voltage (vertical axis) of the edge termination region 102 by assuming the increase increment of an i-th interval $x_j$ between an adjacent two of the FLRs 131 to be 0.075 μm and variously changing the first interval $x_{101}$ (horizontal axis) between the p$^+$-type extension portion 122a and the FLR 131 closest to the chip center are shown in FIGS. 9 and 10. In the conventional example in FIGS. 9 and 10, the total number of the FLRs 131 was assumed to be 30 and 60, respectively. In FIGS. 9 and 10, a horizontal axis indicates widths of the portions left of the ion implantation mask (width covering portion corresponding to the first interval $x_{101}$) for forming the first interval $x_{101}$ between the p$^+$-type extension portion 122a and the FLR 131 closest to the chip center. A mask-dimension lower limit is a lower limit of a necessary width of the portions left of the ion implantation mask so that the first interval $x_{101}$ between the p$^+$-type extension portion 122a and the FLR 131 closest to the chip center is not lost due to impurity diffusion.

From the results in FIG. 9, it was confirmed that breakdown voltage characteristics are stable only at one point, a setting c2 that is the same as a setting c1 (setting in which the increase increment of an i-th interval $x_j$ between an adjacent two of the FLRs 131 is assumed to be 0.075 μm and the first interval $x_{101}$ between the p$^+$-type extension portion 122a and the FLR 131 closest to the chip center is assumed to 0.7 μm) in FIG. 8 for which breakdown voltage characteristics were the most stable of the settings of the conventional example in FIGS. 7 and 8. It was confirmed that in a setting in which the first interval $x_{101}$ between the p$^+$-type extension portion 122a and the FLR 131 closest to the chip center is reduced (origin-side of horizontal axis), breakdown voltage variation due to negative charge increases and in a setting in which the first interval $x_{101}$ between the p$^+$-type extension portion 122a and the FLR 131 closest to the chip center is increased (side apart from origin of 0horizontal axis), breakdown voltage variation due to positive charge increases.

From the results in FIG. 10, it was confirmed that by increasing the total number of the FLRs 131 to 60 to twice that in the conventional example in FIG. 9, in the setting in which the first interval $x_{101}$ between the p$^+$-type extension portion 122a and the FLR 131 closest to the chip center is reduced, while breakdown voltage variation due to negative charge may be suppressed, in a setting in which the first interval $x_{101}$ between the p$^+$-type extension portion 122a and the FLR 131 closest to the chip center is increased, breakdown voltage variation due to positive charge is not improved. Further, the inventors confirmed that the narrower is the first interval $x_{101}$ between the p$^+$-type extension portion 122a and the FLR 131 closest to the chip center, the more difficult the ion implantation process of the FLRs 131 becomes. Further, it was confirmed that the width w102 of the edge termination region 102 of the conventional example in FIG. 10 is 355 μm, which is at least two times longer than the width w102 of the edge termination region 102 (=144 μm) of the conventional example in FIG. 9.

On the other hand, from the results in FIGS. 11 and 12, it was confirmed that in the first and the second examined examples, breakdown voltage variation due to charge in the insulating layer (field oxide film and the interlayer insulating film 19) covering the second surface portion 40b of the front surface of the semiconductor substrate 40 is suppressed compared to the conventional example and compared to the normal state, is less than 100V, the charge being due to long periods of operation under a high temperature. In the first and the second examined examples, the first interval $x_1$ (horizontal axis) between the p$^+$-type extension portion 22a and the FLR 31 closest to the chip center was variously changed and results of simulation of the breakdown voltage BVdss (vertical axis) of the edge termination region 2 are shown in FIGS. 11 and 12. FIGS. 11 and 12 shown an instance in which the insulating layer covering the second surface portion 40b of the front surface of the semiconductor substrate 40 (hereinafter, simply "insulating layer") is positively charged (positive charge is accumulated), an instance in which the insulating layer is negatively charged (negative charge is accumulated), and a normal state when the insulating layer is not charged (zero charge).

In FIGS. 11 and 12, a horizontal axis indicates the widths of the portions left of the ion implantation mask (width covering the first interval $x_1$) for forming the first interval $x_1$ between the p$^+$-type extension portion 22a and the FLR 31 closest to the chip center. A mask-dimension lower limit is a lower limit of a necessary width of the portions left of the ion implantation mask so that the first interval $x_1$ between the p$^+$-type extension portion 22a and the FLR 31 closest to the chip center is not lost due to impurity diffusion. In particular, it was confirmed that in the first and the second examined examples (FIGS. 11 and 12), by setting the first interval $x_1$ between the p$^+$-type extension portion 22a and the FLR 31 closest to the chip center to be at most 1 µm, breakdown voltage variation due to charge in the insulating layer is suppressed, and stable breakdown voltage characteristics compared to the conventional examples in FIGS. 9 and 10 may be obtained.

Therefore, the first interval $x_1$ between the p$^+$-type extension portion 22a and the FLR 31 closest to the chip center is set to be at least 1 µm, whereby margins for dimension variation of the ion implantation mask for forming the FLRs 31 may be taken. Further, from the results for the second examined example in FIG. 12, it was confirmed that by increasing the total number of the FLRs 31, breakdown voltage characteristics may be further stabilized and in a setting in which the first interval $x_1$ between the p$^+$-type extension portion 22a and the FLR 31 closest to the chip center is in a range of 0.6 µm to 1.0 µm, breakdown voltage variation is nearly absent. In the second examined example, it was assumed that 12 of the FLRs 31 are disposed in each of the three FLR segments 30a to 30c and a k-th interval $x_k$ between an adjacent two of the FLRs 31 is a dimension different from that in the first examined example (k=2 to 36).

Further, in the conventional example (refer to FIG. 10), in contrast to breakdown voltage characteristics not being stable even when a total number of the FLRs 131 is set to 60 and the width w102 of the edge termination region 102 is increased to 355 µm, in the second examined example, stable breakdown voltage characteristics may be obtained even when the width w2 of the edge termination region 2 is reduced to 171 µm.

In the foregoing, the present invention is not limited to the embodiments described above and various changes within a range not departing from the spirit of the invention are possible. For example, the present invention is suitably applicable even in an instance in which the front surface of the semiconductor substrate spanning the active region and the edge termination region is flat (free of the drop). Further, the present invention is similarly implemented when conductivity types (n-type, p-type) are reversed.

According to the present invention, the voltage withstanding structure is the FLR structure, whereby the voltage withstanding structure may be formed by a single session of ion implantation and therefore, compared to an instance in which the voltage withstanding structure is a JTE structure, the number of masks and the number of processes may be reduced and manufacturing cost may be reduced. Further, according to the invention described above, the length of the termination region may be reduced, margins for dimension variation of the ion implantation mask may be taken, and breakdown voltage variation due to charge in the insulating layer on the front surface of semiconductor substrate in the termination region may be reduced, the charge being due to operation for long periods.

The present invention achieves an effect in that a low-cost silicon carbide semiconductor device having a voltage withstanding structure capable of stably ensuring a predetermined breakdown voltage and formed by few processes, and a method of manufacturing the silicon carbide semiconductor device may be provided.

As described above, the silicon carbide semiconductor device and the method of manufacturing a silicon carbide semiconductor device according to the present invention are useful for power semiconductor devices used in power converting equipment, power source devices of various types of industrial machines, etc.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

What is claimed is:

1. A silicon carbide semiconductor device, comprising:
   a semiconductor substrate containing silicon carbide and having an active region and a termination region surrounding a periphery of the active region, the semiconductor substrate having a first main surface and a second main surface opposite to each other;
   a first semiconductor region of a first conductivity type, provided in the semiconductor substrate, spanning the active region and the termination region;
   a second semiconductor region of a second conductivity type, provided between the first main surface of the semiconductor substrate and the first semiconductor region in the active region;
   a device element structure having a pn junction between the first semiconductor region and the second semiconductor region, a current that energizes the pn junction flows in the device element structure;
   a second-conductivity-type peripheral region surrounding a periphery of the device element structure, provided between the first main surface of the semiconductor substrate and the first semiconductor region, between the device element structure and the termination region;
   a first electrode provided on the first main surface of the semiconductor substrate, electrically connected to the second semiconductor region and the second-conductivity-type peripheral region;
   a second electrode provided on the second main surface of the semiconductor substrate, electrically connected to the first semiconductor region;
   a plurality of field limiting rings (FLRs) of the second conductivity type, provided at the first main surface of the semiconductor substrate so as to form portions of the first main surface, the FLRs having a floating potential and configuring a FLR structure, the FLRs being provided apart from one another with respective intervals therebetween, each interval being a shortest distance between an adjacent two of the FLRs that are adjacent to each other, and each FLR concentrically surrounding the periphery of the active region, the plurality of FLRs being provided between the first main surface of the semiconductor substrate and the first semiconductor region in the termination region and respectively having a same width in a radial direction thereof that is parallel to the first main surface of the semiconductor substrate, the plurality of FLRs each facing a surface of the second-conductivity-type peripheral region, the surface of the second-conductivity-type peripheral region facing the termination region in a direction parallel to the first main surface of the semiconductor substrate; and an insulating layer provided on the first main surface of the semiconductor substrate, the insulating layer covering surfaces of the plurality of FLRs entirely in the termination region, wherein the plurality of FLRs includes at least one boundary FLR, and is divided into at least two FLR segments with the at least one boundary FLR as a boundary, each FLR segment including at least 12 FLRs, an interval between any adjacent two of the FLRs that are adjacent to each other is wider than an interval between the second-conductivity-type peripheral region and a first FLR of the plurality of FLRs closest to the second-conductivity-type peripheral region, within a same FLR segment, an interval of an adjacent two of the FLRs increases as the adjacent two of the FLRs approaches an end of the semiconductor substrate by an increment in arithmetic progression, each increment in arithmetic progression of each FLR segment among the at least two FLR segments increases as said each FLR segment approaches the end of the semiconductor substrate, resulting in different increments in arithmetic progression respectively in respective ones of the at least two FLR segments, and the interval between the second-conductivity-type peripheral region and the first FLR closest to the second-conductivity-type peripheral region is in a range of 0.6 µm to 1.0 µm.

2. The silicon carbide semiconductor device according to claim 1, further comprising
a third semiconductor region of the first conductivity type, provided between the first main surface of the semiconductor substrate and the plurality of FLRs.

3. The silicon carbide semiconductor device according to claim 1, wherein
a total number of FLRs included in the plurality of FLRs is at least 30.

4. The silicon carbide semiconductor device according to claim 1, wherein
each FLR of the plurality of FLRs has an impurity concentration in a range of $1\times10^{18}/cm^3$ to $1\times10^{21}/cm^3$.

5. The silicon carbide semiconductor device according to claim 1, wherein said same width of each FLR of the plurality of FLRs in a range of 2 µm to 5 µm.

6. The silicon carbide semiconductor device according to claim 2, wherein
the third semiconductor region has a thickness that is at most 0.4 µm.

7. The silicon carbide semiconductor device according to claim 1, wherein
said each increment is in a range of 0.05 µm to 0.12 µm.

8. The silicon carbide semiconductor device according to claim 1, wherein
the at least two FLR segments includes a first FLR segment that is closest to the second-conductivity-type peripheral region and a second FLR segment that is adjacent to an end-side of the first FLR segment, the end-side of first FLR segment facing a chip end, the boundary between the first FLR segment and the second FLR segment being located between a second or subsequent FLR of the plurality of FLRs from the second-conductivity-type peripheral region and a FLR of the plurality of FLRs closer to the second-conductivity-type peripheral region than is the second or subsequent FLR.

9. The silicon carbide semiconductor device according to claim 8, wherein
the at least two FLR segments further includes a third FLR segment closest to the chip end and the second FLR segment adjacent to a side of the third FLR segment, the side of the third FLR segment facing the second-conductivity-type peripheral region, the boundary between the third FLR segment and the second FLR segment being located between one FLR among the plurality of FLRs closer to the second-conductivity-type peripheral region than is a third or subsequent FLR from the chip end, and another FLR among the plurality of FLRs closer to the second-conductivity-type peripheral region than is the one FLR.

10. The silicon carbide semiconductor device according to claim 1, wherein
the second-conductivity-type peripheral region has an upper portion and a lower portion, the upper portion being relatively closer to the first main surface of the semiconductor substrate and having an impurity concentration that is a same as an impurity concentration of the second semiconductor region, the lower portion being relatively closer to the first semiconductor region and having an impurity concentration that is the same as an impurity concentration of the FLRs.

11. The silicon carbide semiconductor device according to claim 1,
wherein the device element structure includes:
a plurality of fourth semiconductor regions of the first conductivity type, selectively provided between the first main surface of the semiconductor substrate and the second semiconductor region, the fourth semiconductor regions being electrically connected to the first electrode;
a plurality of trenches penetrating through the fourth semiconductor regions and the second semiconductor region and reaching the first semiconductor region;
a plurality of gate electrodes provided in the trenches via a plurality of gate insulating films;
a plurality of first high-concentration regions of the second conductivity type, selectively provided between the first semiconductor region and the second semiconductor region, apart from the second semiconductor region, and closer to the second electrode than are bottoms of the trenches, the first high-concentration regions facing the bottoms of the trenches in a depth direction and having an impurity concentration higher than an impurity concentration of the second semiconductor region; and
a plurality of second high-concentration regions of the second conductivity type, selectively provided between the first semiconductor region and the second semiconductor region, apart from the trenches and the first high-concentration regions, and in contact with the second semiconductor region, the second high-concentration regions being closer to the second electrode than are the bottoms of the trenches and having a same impurity concentration as the impurity concentration of the first high-concentration regions, and
wherein the plurality of FLRs and the first high-concentration regions have impurity concentrations that are the same as each other.

12. A method of manufacturing the silicon carbide semiconductor device according to claim 1, the method comprising:
forming a first first-conductivity-type semiconductor layer constituting the first semiconductor region;
selectively forming a first portion of the second-conductivity-type peripheral region and the plurality of FLRs in surface regions of the first first-conductivity-type semiconductor layer;
forming a second first-conductivity-type semiconductor layer constituting the first semiconductor region, on the first first-conductivity-type semiconductor layer;
selectively forming a second portion of the second-conductivity-type peripheral region at a position facing the first portion of the second first-conductivity-type semiconductor layer in a depth direction, the second portion reaching the first portion;
forming a second-conductivity-type semiconductor layer on the second first-conductivity-type semiconductor layer in the active region, a portion of the second-conductivity-type semiconductor layer facing the second portion in the depth direction constituting a third portion of the second-conductivity-type peripheral region and a remaining portion constituting the second semiconductor region;
forming the insulating layer on the first main surface of the semiconductor substrate so as to cover the surfaces of the plurality FLRs entirely in the termination region;
forming the first electrode to be electrically connected to the second semiconductor region and the second-conductivity-type peripheral region; and
forming the second electrode to be electrically connected to the first semiconductor region.

13. The method according to claim 12,
wherein the device element structure includes:
a plurality of fourth semiconductor regions of the first conductivity type, selectively provided between the first main surface of the semiconductor substrate and the second semiconductor region, the fourth semiconductor regions being electrically connected to the first electrode;
a plurality of trenches penetrating through the fourth semiconductor regions and the second semiconductor region and reaching the first semiconductor region;
a plurality of gate electrodes provided in the trenches via a plurality of gate insulating films;
a plurality of first high-concentration regions of the second conductivity type, selectively provided between the first semiconductor region and the second semiconductor region, apart from the second semiconductor region, and closer to the second electrode than are bottoms of the trenches, the first high-concentration regions facing the bottoms of the trenches in the depth direction and having an impurity concentration higher than an impurity concentration of the second semiconductor region; and
a plurality of second high-concentration regions of the second conductivity type, selectively provided between the first semiconductor region and the second semiconductor region, apart from the trenches and the first high-concentration regions, and in contact with the second semiconductor region, the second high-concentration regions being closer to the second electrode than are the bottoms of the trenches and having a same impurity concentration as the impurity concentration of the first high-concentration regions,
wherein said selectively forming the first portion and the plurality of FLRs further includes selectively forming the first high-concentration regions and respective fourth portions of the second high-concentration regions in the surface regions of the first first-conductivity-type semiconductor layer, and
wherein said selectively forming the second portion includes
in the second first-conductivity-type semiconductor layer,
selectively forming the second portion reaching the first portion at a position facing the first portion in the depth direction, and
selectively forming respective fifth portions of the second high-concentration regions reaching the respective fourth portions at positions respectively facing the respective fourth portions in the depth direction.

* * * * *